(12) United States Patent
Furiata et al.

(10) Patent No.: US 7,585,540 B2
(45) Date of Patent: *Sep. 8, 2009

(54) METHOD FOR MANUFACTURING WIRING SUBSTRATE

(75) Inventors: Hidemichi Furiata, Nagano (JP); Satoshi Kimura, Nagano (JP); Minoru Marumo, Nagano (JP)

(73) Assignee: Seiko Epson Corporation (JP)

( * ) Notice: Subject to any disclaimer, the term of this patent is extended or adjusted under 35 U.S.C. 154(b) by 283 days.

This patent is subject to a terminal disclaimer.

(21) Appl. No.: 11/091,919

(22) Filed: Mar. 28, 2005

(65) Prior Publication Data

US 2005/0218110 A1 Oct. 6, 2005

(30) Foreign Application Priority Data

Mar. 30, 2004 (JP) ............................. 2004-098685

(51) Int. Cl.
*B05D 5/12* (2006.01)
*B05D 3/12* (2006.01)

(52) U.S. Cl. .................. 427/96.1; 427/98.4; 427/98.5; 427/99.1; 427/301; 427/304

(58) Field of Classification Search ................ 427/96.1, 427/98.4, 98.5, 99.1, 301, 304
See application file for complete search history.

(56) References Cited

U.S. PATENT DOCUMENTS

| | | | | |
|---|---|---|---|---|
| 3,783,005 A | * | 1/1974 | Kenney | ........................ 205/78 |
| 3,918,927 A | * | 11/1975 | Wells | ........................ 428/607 |
| 4,668,553 A | * | 5/1987 | Scott et al. | ..................... 428/92 |
| 4,735,820 A | * | 4/1988 | Agostino et al. | .............. 216/67 |
| 5,114,744 A | * | 5/1992 | Cloutier et al. | ............. 427/542 |
| 2004/0237295 A1 | | 12/2004 | Wakizaka et al. | |

FOREIGN PATENT DOCUMENTS

| | | |
|---|---|---|
| EP | 0817549 | 7/1998 |
| JP | 10-065315 | 3/1998 |
| JP | 10-75038 | 3/1998 |
| JP | 2001-230527 | 8/2001 |
| JP | 2003-253455 | 9/2003 |
| JP | 2003-293144 | 10/2003 |
| JP | 10-065315 * | 3/2006 |

OTHER PUBLICATIONS

Communication from Japanese Patent Office regarding corresponding application.

* cited by examiner

*Primary Examiner*—Brian K Talbot
(74) *Attorney, Agent, or Firm*—Harness, Dickey & Pierce, P.L.C.

(57) ABSTRACT

A method for manufacturing a wiring substrate includes the steps of: (a) patterning a surface-active agent on a substrate having first and second areas to be remained on the first area; (b) removing residues of the surface-active agent in the second area by wet-etching with an alkali; (c) patterning a catalyst to be remained on one of the second area of the substrate and the surface-active agent; and (d) depositing a metal layer on the catalyst to thereby form a wiring.

3 Claims, 17 Drawing Sheets

METHOD FOR MANUFACTURING WIRING SUBSTRATE

RELATED APPLICATIONS

This application claims priority to Japanese Patent Application No. 2004-098685 filed Mar. 30, 2004 which is hereby expressly incorporated by reference herein in its entirety.

BACKGROUND

1. Technical Field

The present invention relates to methods for manufacturing wiring substrates and methods for manufacturing electronic devices.

2. Related Art

Wirings are required to be patterned in high accuracy. For example, a subtractive method and an additive method are known as a method for forming wirings on a flexible substrate. In the subtractive method, a metal layer is formed over the entire surface of a flexible substrate, a photoresist is formed on the metal layer by patterning, and the metal layer is etched by using the photoresist as a barrier. In the additive method, a photoresist is formed on a flexible substrate by patterning, and a metal layer is deposited by a plating process in an opening section in the photoresist.

These methods have limitations in attaining a higher level of patterning accuracy because the measurement accuracy of wirings depends on the resolution of photoresist. Catalysts may be patterned by a laser beam. However, because parts of the catalysts are not necessarily completely removed when the patterning shape becomes minute, and there is a possibility of re-adhesion of the catalysts, this process is not adequate to pattern wirings in high accuracy.

It is an object of the present invention to pattern wirings in high accuracy with a simple manufacturing process.

SUMMARY

A method for manufacturing a wiring substrate, in accordance with the present invention, comprises the steps of:

(a) patterning a surface-active agent on a substrate having first and second areas to be remained in the first area;

(b) removing residue of the surface-active agent in the second area by wet-etching with an alkali;

(c) patterning a catalyst to be remained on one of the second area of the substrate and the surface-active agent; and (d) depositing a metal layer on the catalyst to thereby form a wiring.

According to the present invention, residue of the surface-active agent generated in the second area is removed, such that the surface-active agent can be patterned in higher accuracy. Accordingly, wirings that match with minute pitches can be formed.

The method for manufacturing a wiring substrate may further include the steps of:

patterning the catalyst to be remained on the surface-active agent in the step (c), and removing residue of the catalyst generated in the second area by wet-etching with an acid before the step (d).

According to this method, residue of the surface-active agent generated in the second area is removed, such that the surface-active agent can be patterned in higher accuracy.

The method for manufacturing a wiring substrate may further include the steps of:

patterning the catalyst to be remained in the second area of the substrate in the step (c), and removing residue of the catalyst generated on the surface-active agent by wet-etching with an acid before the step (d).

According to this method, residue of the catalyst generated on the surface-active agent is removed, such that the catalyst can be patterned in higher accuracy.

In the method for manufacturing a wiring substrate, the step (a) may include the steps of:

($a_1$) providing the surface-active agent in the first and second areas of the substrate, ($a_2$) irradiating vacuum ultraviolet radiation to the second area of the substrate, and ($a_3$) patterning the surface-active agent to be remained in the first area by washing the substrate.

Accordingly, the surface-active agent is patterned by the irradiation of vacuum ultraviolet radiation. As a result, metal layers can be deposited only to required portions along a specified pattern configuration. Therefore, for example, there is no need to form masks with resist layers or the like.

In the method for manufacturing a wiring substrate, the substrate may have at least one of a C—C, C=C, C—F, C—H, C—Cl, C—N, C—O, N—H and O—H bond.

In the method for manufacturing a wiring substrate, the substrate may have at least a C=C bond, and the vacuum ultraviolet radiation may have a property that is capable of decomposing at least a C=C bond.

In the method for manufacturing a wiring substrate, a source of light of the vacuum ultraviolet radiation may be an excimer lamp enclosing Xe gas therein.

In the method for manufacturing a wiring substrate, in the step (a), a droplet discharge method may be applied to pattern the surface-active agent. Accordingly, the surface-active agent is patterned by the droplet discharge method. As a result, metal layers can be deposited only to required portions along a specified pattern configuration. Therefore, for example, there is no need to form masks with resist layers or the like.

In the method for manufacturing a wiring substrate, the droplet discharge method may be an ink jet method.

A method for manufacturing a wiring substrate in accordance with the present invention includes the steps of:

(a) patterning a catalyst to be remained in a specified area of a substrate;

(b) removing residue of the catalyst generated in an area other than the specified area by wet-etching with an acid; and (c) forming a wiring along the specified area by depositing a metal layer to the catalyst.

According to the present invention, residue of the catalyst generated in areas other than the specified area is removed, such that the catalyst can be patterned in higher accuracy. Therefore, wirings that match with minute pitches can be formed.

A method for manufacturing a wiring substrate in accordance with the present invention, includes the steps of:

(a) providing a first surface-active agent in first and second areas of a substrate;

(b) providing a second surface-active agent in the first area of the substrate;

(c) providing a catalyst on the second surface-active agent;

(d) removing residue of the catalyst generated on the first surface-active agent by wet-etching with an acid; and (e) forming a wiring along the first area by precipitating a metal layer to the catalyst.

According to the present invention, residue of the catalyst generated on the first surface-active agent is removed, such that the catalyst can be patterned in higher accuracy. Therefore, wirings that match with minute pitches can be formed. Furthermore, by providing the surface-active agents with a two-layer structure, the catalyst can be selectively provided on either of the surface-active agents, such that metal layers can be deposited only in required portions along a specified pattern configuration. Therefore, for example, there is no need to form masks with resist layers or the like.

A method for manufacturing a wiring substrate in accordance with the present invention includes the steps of:

(a) providing a first surface-active agent in first and second areas of a substrate;

(b) providing a second surface-active agent in the first area of the substrate;

(c) providing a catalyst on the first surface-active agent;

(d) removing residue of the catalyst generated on the second surface-active agent by wet-etching with an acid; and (e) forming a wiring along the second area by depositing a metal layer to the catalyst.

According to the present invention, residue of the catalyst generated on the second surface-active agent is removed, such that the catalyst can be patterned in higher accuracy. Therefore, wirings that match with minute pitches can be formed. Furthermore, by providing the surface-active agents with a two-layer structure, the catalyst can be selectively provided on either of the surface-active agents, such that metal layers can be deposited only in required portions along a specified pattern configuration. Therefore, for example, there is no need to form masks with resist layers or the like.

A method for manufacturing a wiring substrate in accordance with the present invention includes the steps of:

(a) irradiating vacuum ultraviolet radiation to a second area of a substrate having a first area and the second area, to decompose interatomic bonds in the second area of the substrate;

(b) providing a catalyst in the first and second areas of the substrate;

(c) patterning the catalyst to be remained in the first area by washing the substrate;

(d) removing residue of the catalyst generated in the second area by wet-etching with an acid; and (e) forming a wiring along the first area by precipitating a metal layer to the catalyst.

According to the present invention, residue of the catalyst generated on the second surface-active agent is removed, such that the catalyst can be patterned in higher accuracy. Therefore, wirings that match with minute pitches can be formed. Furthermore, because the catalyst is patterned by the irradiation of vacuum ultraviolet radiation, metal layers can be deposited only in required portions along a specified pattern configuration. For this reason, for example, there is no need to form masks with resist layers or the like.

A method for manufacturing an electronic device in accordance with the present invention includes the method for manufacturing a wiring substrate described above, and further includes the steps of mounting a semiconductor chip having an integrated circuit on the wiring substrate, and mounting the wiring substrate on a circuit substrate.

BRIEF DESCRIPTION OF THE DRAWINGS

FIG. 12 (A) and FIG. 12(B) are views illustrating the second embodiment of the present invention.

DETAILED DESCRIPTION

Figure 1:
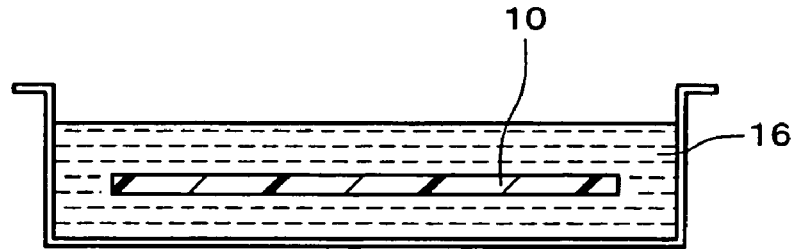
FIG. 1(A)-FIG. 1(C) are views illustrating a first embodiment of the present invention.
Figure 1:
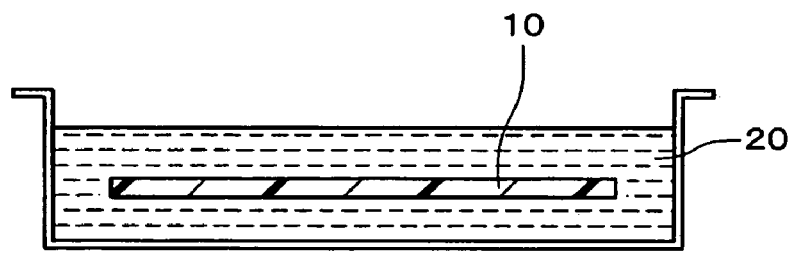
Figure 1:
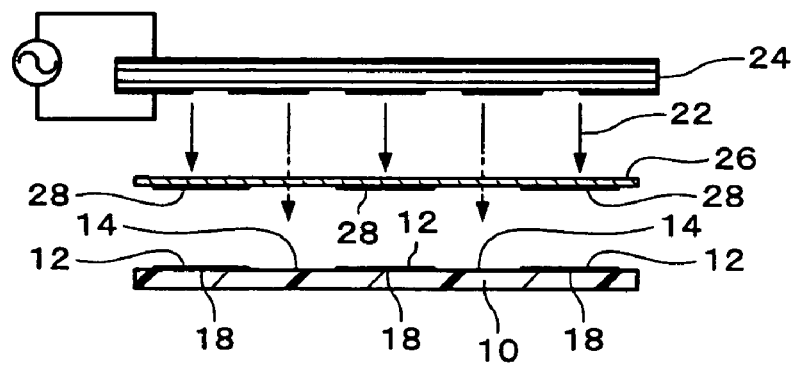
Figure 2:
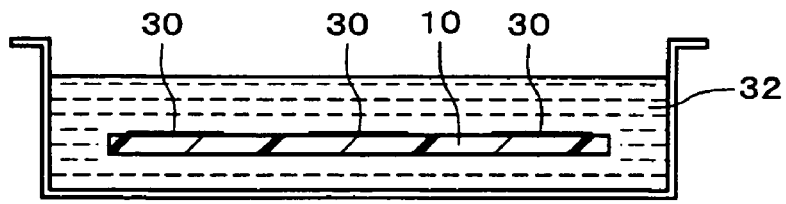
FIG. 2(A) and FIG. 2(B) are views illustrating the first embodiment of the present invention.
Figure 2:
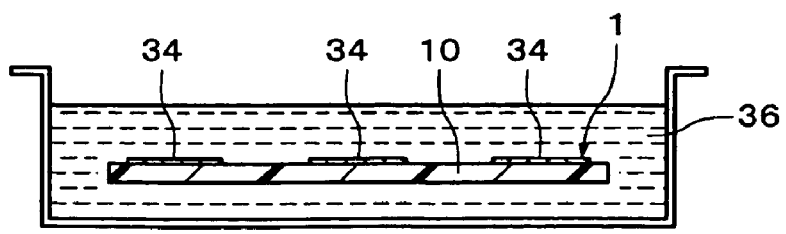
Figure 3:
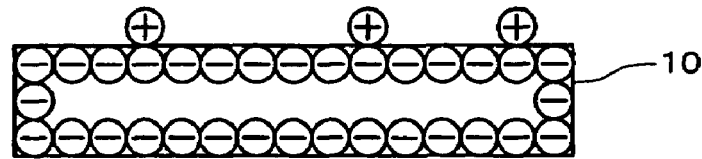
FIG. 3(A)-FIG. 3(D) are views illustrating the first embodiment of the present invention.
Figure 3:
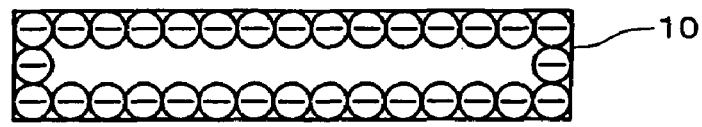
Figure 3:
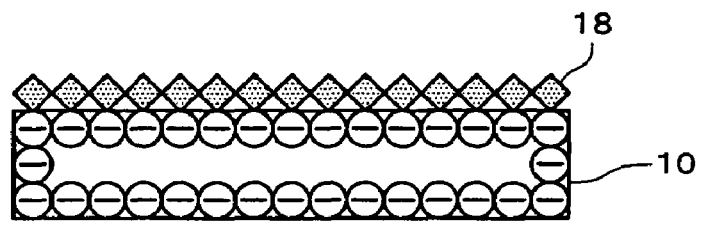
Figure 3:
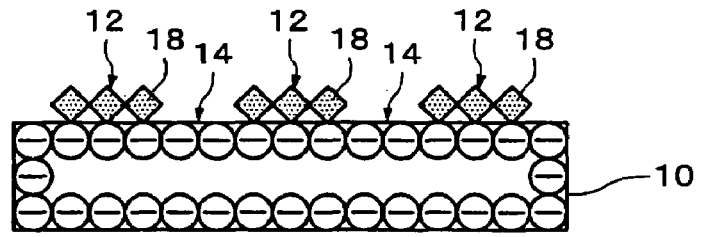
Figure 4:
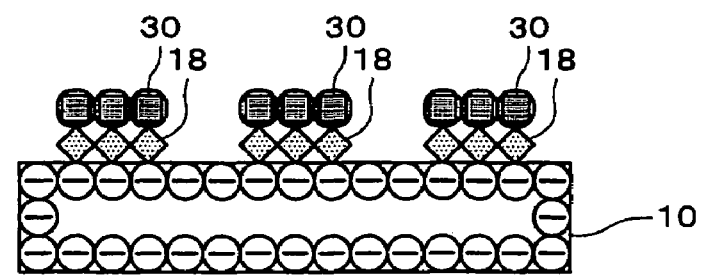
FIG. 4(A) and FIG. 4(B) are views illustrating the first embodiment of the present invention.
Figure 4:
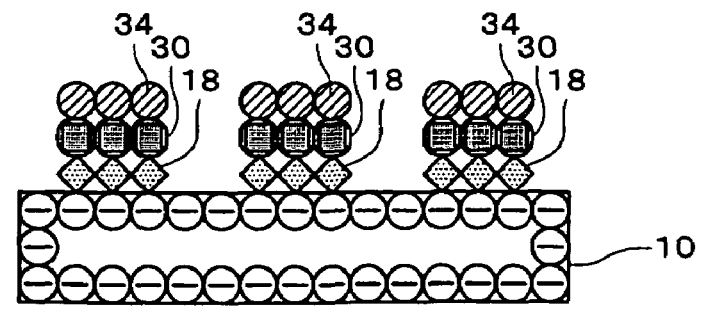
Figure 5:
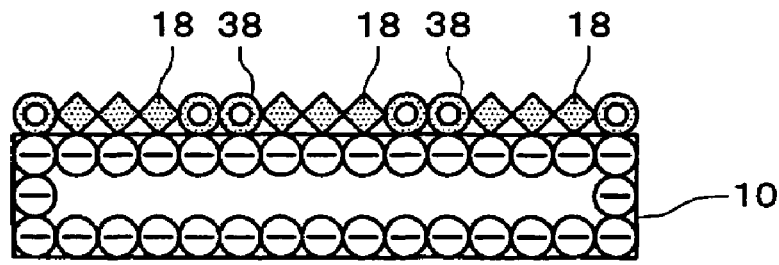
FIG. 5(A) and FIG. 5(B) are views illustrating the first embodiment of the present invention.
Figure 5:
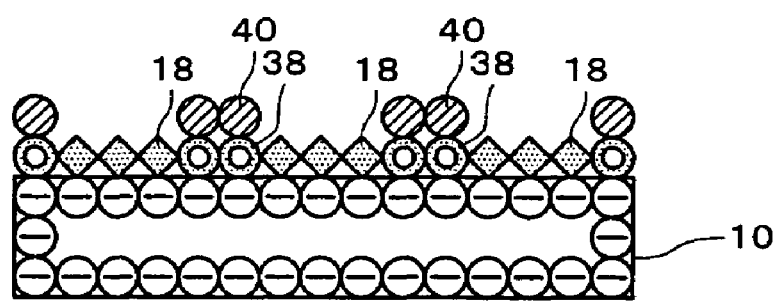

Embodiments of the present invention are described below with reference to the accompanying drawings.

First Embodiment

FIG. 1(A)-FIG. 7 are views indicating a method for manufacturing a wiring substrate in accordance with a first embodiment of the present invention. In the present embodiment, a wiring substrate is manufactured using an electroless plating method.

First Example of First Embodiment

FIG. 1(A)-FIG. 4(B), FIG. 6 and FIG. 7 are views indicating a first example of the present embodiment. FIG. 1(A)-FIG. 2(B) are views for describing steps of the electroless plating method, and FIG. 3(A) -FIG. 4(B) are views schematically illustrating a substrate in each of the steps of the electroless plating method.

A substrate (sheet) 10 may be a flexible substrate. As the flexible substrate, a FPC (Flexible Printed Circuit), a COF (Chip On Film) substrate, or a TAB (Tape Automated Bonding) substrate may be used. The substrate 10 is formed from an organic material (for example, resin). As the substrate 10, a polyimide substrate or a polyester substrate may be used. The substrate 10 has organic interatomic bonds. The substrate 10 may have at least one of C—C, C=C, C—F, C—H, C—Cl, C—N, C—O, N—H and O—H bonds. The substrate 10 may have at least C=C bonds. In the present embodiment, a wiring is formed on one of surfaces of the substrate 10. Alternatively, wirings may be formed on both of the surfaces of the substrate 10. The substrate 10 has first and second areas 12 and 14 (see FIG. 1(C) and FIG. 3(D)). The first and second areas 12 and 14 are areas in the surface of the substrate 10 where wirings are formed.

As a modified example, the substrate 10 may be composed of an inorganic material (for example, a glass substrate or a ceramic substrate), or may be composed of organic system and inorganic system compound material (for example glass epoxy substrate).

As shown in FIG. 3(A), a substrate with its surface potential (surface potential in a liquid) being a negative potential may be used as the substrate 10. In the case of organic materials, the surface potential of the substrate 10 is often a negative potential.

As shown in FIG. 1(A) and FIG. 3(B), the substrate 10 may be washed with an alkali. By so doing, nonuniformity of the surface potential in the first and second areas 12 and 14 of the substrate 10 can be made uniformly in a negative potential. Concretely, the substrate 10 may be soaked in an alkaline solution (for example, sodium hydroxide with a concentration of 1 wt %-10 wt %) 16 in room temperature for about 10-60 minutes, and then it can be washed with water. When a surface portion of the substrate 10 is hydrolyzed by alkali washing, the surface portion becomes a hydrolyzed layer, and the surface portion also has a negative potential and its potential becomes more uniform than it is before the washing.

It is noted that, by conducting the alkali washing described above, cleaning and surface roughening treatments can be applied to the substrate 10 at the same time. Accordingly, the adhesion of a metal layer (wiring) can be improved.

As shown in FIG. 1(B) and FIG. 3(C), a surface-active agent 18 is provided in the first and second areas 12 and 14 of the substrate 10. The surface-active agent 18 may be provided over the entire area of one of the surfaces of the substrate 10. In accordance with the present embodiment, the first surface-active agent 18 has a property to cationize. As the surface-active agent 18, a cationic system surface-active agent (a cation surface-active agent or one having a property equal to the same) may be used. In the present example, the surface potential of the first and second areas 12 and 14 of the substrate 10 is a negative potential. Accordingly, when the cationic system surface-active agent is used, the negative potential of the substrate 10 can be neutralized or reversed to a positive potential. It is noted that, by the use of the surface-active agent, the surface potential can be freely adjusted without depending on the property of the substrate 10, and also the surface potential can be made uniform such that a stable potential surface can be formed.

In the example shown in FIG. 1(B), the substrate 10 is dipped in a surface-active agent solution 20. More specifically, the substrate 10 is dipped in a cation surface-active agent solution of an alkyl ammonium chloride system at room temperature for about 1 minute to 10 minutes, and then washed with pure water. Then, the substrate 10 is placed in a room temperature atmosphere, and is sufficiently dried.

As shown in FIG. 1(C) and FIG. 3(D), among the surface-active agent 18 provided in the first and second areas 12 and 14, portions thereof provided in the second area 14 are removed. In other words, the surface-active agent 18 is patterned to be remained along the first area 12.

In the present example, vacuum ultraviolet radiation (VUV: vacuum ultraviolet radiation) 22 is irradiated to the second area 14 of the substrate 10. More specifically, a mask 26 is disposed between a source of light 24 and the substrate 10, and the vacuum ultraviolet radiation 22 is irradiated to the substrate 10 through the mask 26. The vacuum ultraviolet radiation 22 is covered by a pattern 28 of the mask 26, and penetrates other areas thereof. As the vacuum ultraviolet radiation 22 is irradiated, interatomic bonds in the second area 14 of the substrate 10 are (chemically) decomposed. In the present example, the second area 14 of the substrate 10 is not mechanically cut. According to the above, the vacuum ultraviolet radiation 22 is used mainly for the action to decompose interatomic bonds of the substrate 10, and therefore its energy can be lowered compared with the case where the substrate 10 is cut. Accordingly, for example, distortion by heat can be prevented from being generated in the substrate 10. Moreover, parts of the substrate 10 can be prevented from dispersing and adhering to other parts.

It is noted here that, in the present example, the first area 12 is an area where metal layers (wirings) are formed, and has a predetermined pattern configuration. The second area 14 has a configuration that is reverse to that of the first area 12 in the surface of the substrate 10.

The wavelength of the vacuum ultraviolet radiation 22 may be 100 nm-200 nm (for example, 100 nm-180 nm). The vacuum ultraviolet radiation 22 has a property (for example, wavelength) that is capable of decomposing organic interatomic bonds. The vacuum ultraviolet radiation 22 may have a property (for example, wavelength) that is capable of decomposing at least C=C bonds of the substrate 10. The vacuum ultraviolet radiation 22 may have a property (for example, wavelength) that is capable of decomposing all of interatomic bonds (at least one of C—C, C=C, C—F, C—H, C—Cl, C—N, C—O, N—H and O—H bonds) of the substrate 10. An excimer lamp enclosing Xe gas therein may be used as a source of light 24 (with a wavelength of 172 nm). By using the lamp, a condenser lens for generating a laser beam and the time for scanning with the laser beam become unnecessary, and thus the manufacturing process can be simplified.

Concretely, as shown in FIG. 1(C), a mask 26 is disposed on a wiring forming surface of the substrate 10. The mask 26 may be a photomask or a metal mask. For example, as the mask 26, a mask of high purity silica glass for vacuum ultraviolet radiation (with a transmittance of 80% or higher to vacuum ultraviolet radiation) having a pattern of chrome formed thereon is used. In FIG. 1(C), the mask 26 is shown to be disposed above and separated from the substrate 10, but the mask 26 is in effect disposed in contact with the substrate 10. The source of light 24, the mask 26, and the substrate 10 may be disposed in a nitrogen atmosphere. The vacuum ultraviolet radiation 22, when it is in the nitrogen atmosphere, is irradiated up to the distance of about 10 mm without attenuating. When neither the substrate 10 nor the mask 26 comes in contact uniformly due to an elasticity and/or a warp of the substrate 10, an outer circumference portion of the mask 26 may be retained with a holder, and the back of the substrate 10 may be pressed toward the mask 26 side in an area of the same size as the mask 26. The source of light 24 is placed close to the substrate 10 as much as possible (for example, 10 mm or less). As the source of light 24, for example, an excimer VUV/03 Cleaning Unit (Manufacturer's name; Ushio Electric Co., Model; UER20-172A/B, and Lamp specification; Dielectric barrier discharge excimer lamp enclosing Xe gas therein) may be used. When the material of the substrate 10 consists of polyimide, the output is adjusted to about 10 mW and irradiation is conducted for about ten minutes. In the present example, the vacuum ultraviolet radiation 22 is irradiated to one of the surfaces of the substrate 10. However, when wirings are to be formed on both sides of the substrate 10, the vacuum ultraviolet radiation 22 may be irradiated to each of the faces of the substrate 10 one by one or to both of them at the same time.

After irradiation of the vacuum ultraviolet radiation 22, the substrate 10 is washed (for example, by wet washing). By so doing, portions in the substrate 10 where the interatomic bonds are decomposed are removed. In other words, by washing, the surface-active agent 18 on the second area 14 is removed. As the washing method, the substrate 10 may be dipped in a washing solution, or a shower thereof may be jetted to the substrate 10. An alkaline solution (a strong alkaline solution or a weak alkaline solution) or pure water may be used as the washing solution. Shower washing with pure water or high-pressure jet washing with pure water may be applied as the shower method. Supersonic vibration may be added at the time of washing. By washing, the surface-active agent 18 remains in the first area 12, and the surface-active agent 18 in the second area 14 is removed such that the surface of the substrate 10 is exposed.

As a modified example, when the substrate 10 includes an inorganic system material (glass or ceramic), portions of the surface-active agent provided in the second areas 14 are chemically decomposed by the vacuum ultraviolet radiation 22. Then, when the substrate 10 is later washed, the surface-active agent 18 in the second areas 14 can be removed.

Figure 6:
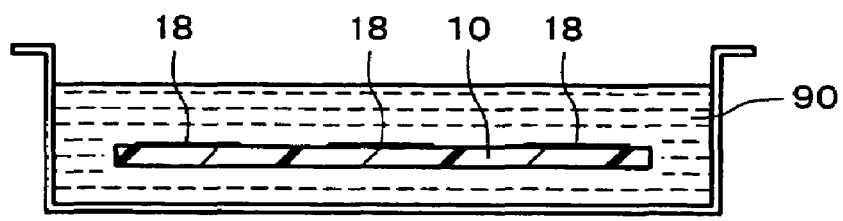
FIG. 6 is a view illustrating the first embodiment of the present invention.

Next, as shown in FIG. 6, wet-etching with an alkali is conducted. By this, residues of the surface-active agent 18 generated in a small amount in the second area 14 are removed. For example, the substrate 10 may be dipped in an etching solution (an alkaline solution) 90, thereby conducting the wet-etching. More specifically, the substrate 10 may be dipped in a sodium hydroxide solution (5 wt %-20 wt % in concentration) for about 30 seconds to about 5 minutes. The entire substrate 10 may be uniformly wet-etched. Alternatively, only the second area 14 may be wet-etched with the first area 12 covered by a mask. As the wet-etch method, the dipping method described above may be used, or a shower (spray) method may be used.

In the present process, residues of the surface-active agent 18 generated in the second area 14 are removed, such that the surface-active agent 18 can be patterned in higher accuracy. More specifically, the existence or nonexistence of the surface-active agent 18 at a boundary section between the first and second areas 12 and 14 becomes clearly defined. Accordingly, wirings that match with minute pitches can be formed.

As shown in FIG. 2(A) and FIG. 4(A), a catalyst (plating catalyst) 30 is provided on a portion of the surface-active agent 18 remaining in the first area 12. The catalyst 30 causes precipitation of a metal layer (plating layer) in an electroless plating liquid, and may be, for example, palladium. A resin for bonding may not be included in the catalyst 30.

In the example shown in FIG. 2(A), the substrate 10 is dipped in a catalyst liquid 32 including tin-palladium. More specifically, the substrate 10 is dipped in a tin-palladium colloidal catalyst liquid of approximately PH1 for 30 seconds-3 minutes at room temperature, and then sufficiently washed with clear water. Tin-palladium colloidal particles have a negative charge, and are adsorbed to the surface-active agent 18 (cationic system surface-active agent). Then, the substrate 10 is dipped in a solution including a fluoroborate acid at room temperature for 30 seconds-3 minutes for activation of the catalyst, and then washed with clear water. As a result, the tin colloidal particles are removed, and palladium alone can be precipitated on the surface-active agent 18 (cationic system surface-active agent).

Figure 7:
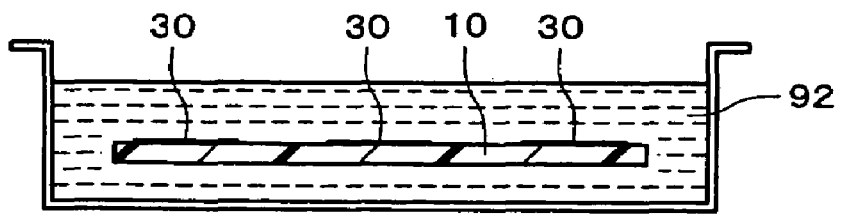
FIG. 7 is a view illustrating the first embodiment of the present invention.
Figure 8:
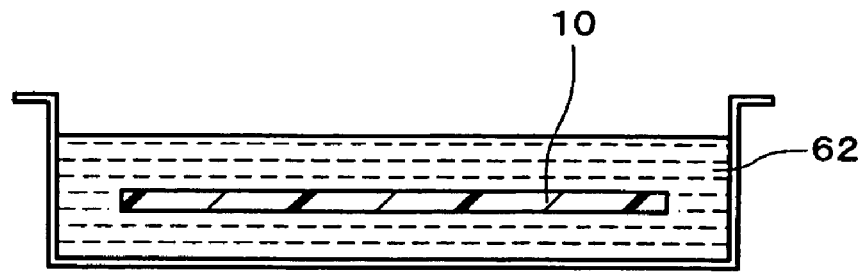
FIG. 8(A) and FIG. 8(B) are views illustrating a second embodiment of the present invention.
Figure 8:
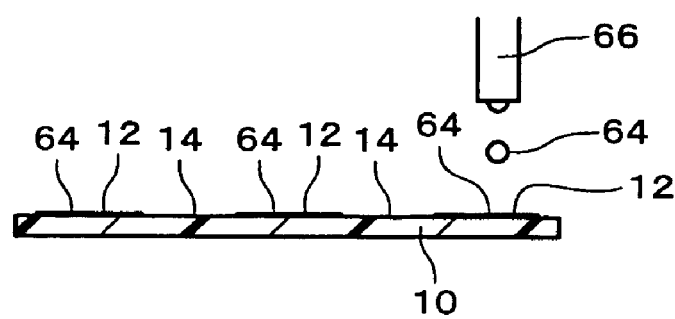
Figure 9:
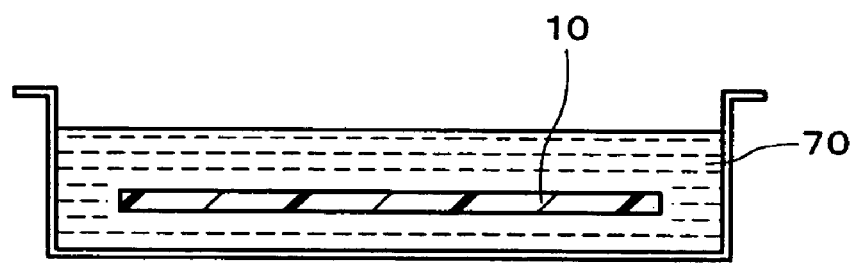
FIG. 9(A) and FIG. 9(B) are views illustrating the second embodiment of the present invention.
Figure 9:
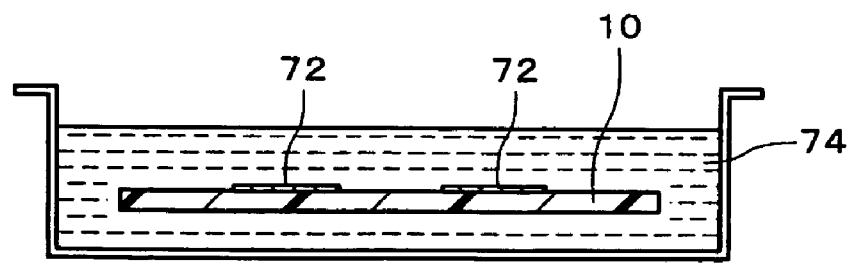
Figure 10:
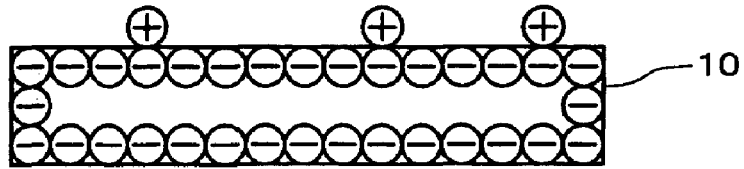
FIG. 10(A)-FIG. 10(C) are views illustrating the second embodiment of the present invention.
Figure 10:
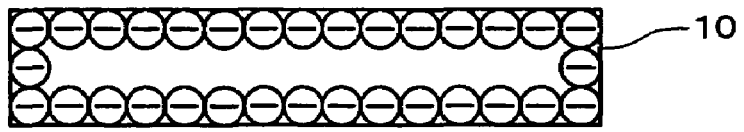
Figure 10:
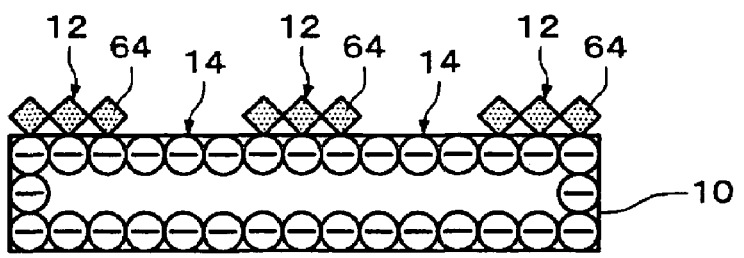
Figure 11:
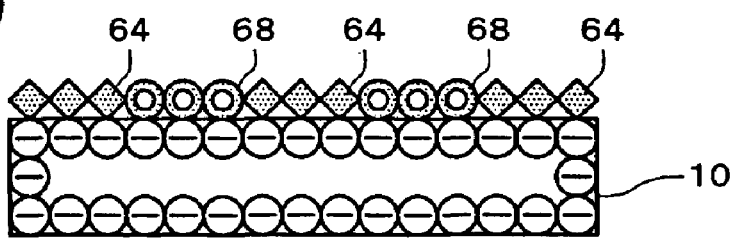
FIG. 11(A) and FIG. 11(B) are views illustrating the second embodiment of the present invention.
Figure 11:
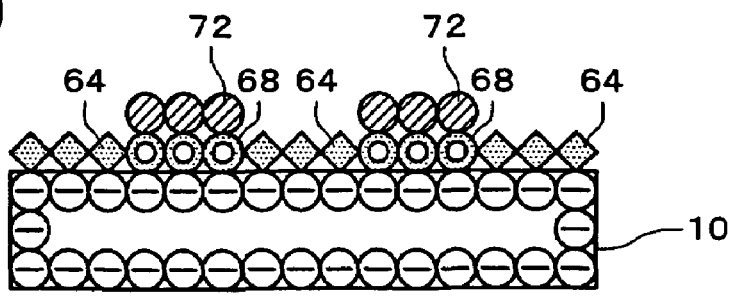
Figure 12:
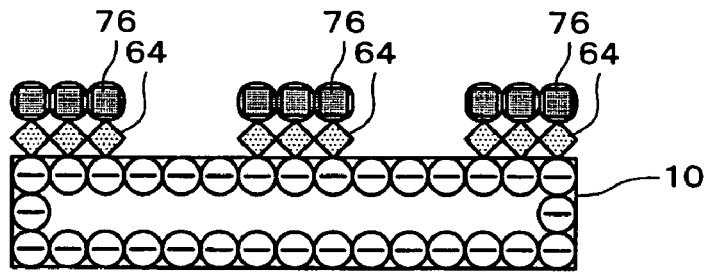
Figure 12:
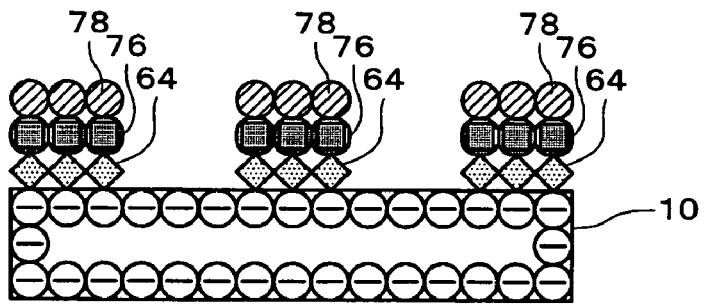

Next, as shown in FIG. 7, wet-etching with an acid is conducted. By this, residues of the surface-active agent 30 generated in a small amount in the second area 14 are removed. For example, the substrate 10 may be dipped in an etching solution (an acidic solution) 92, thereby conducting the wet-etching. More specifically, the substrate 10 may be dipped in a hydrochloric acid solution (1 wt %-10 wt % in concentration) for about 30 seconds to about 3 minutes. The entire substrate 10 may be uniformly wet-etched. A small amount of the catalyst 30 adheres to the second area 14 due to an action different from that of potential, and its adhesion force is weaker than adhesion caused by potential, such that only residues generated in the second area 14 can be removed. Alternatively, only the second area 14 may be wet-etched with the first area 12 covered by a mask. As the wet-etching method, the dipping method described above may be used, or a shower (spray) method may be used.

In the present process, residues of the surface-active agent 30 generated in the second area 14 are removed, such that the surface-active agent 30 can be patterned in higher accuracy. More specifically, the existence or nonexistence of the surface-active agent 30 at a boundary section between the first and second areas 12 and 14 becomes clearly defined. Accordingly, wirings that match with minute pitches can be formed.

As shown in FIG. 2(B) and FIG. 4(B), a metal layer 34 is precipitated to the catalyst 30. Because the catalyst 30 is provided on the surface-active agent 18, and the surface-active agent 18 is exposed along the first area 12, the metal layer 34 can be formed in a pattern configuration along the first area 12. The metal layer 34 may be formed with one layer, or may be formed with multiple layers. The material of the metal layer 34 is not limited, and may be, for example, any one of Ni, Au, Ni+Au, Cu, Ni+Cu and Ni+Au+Cu. A catalyst may be selected according to the material of the metal layer 34 to be deposited.

In the example shown in FIG. 2(B), the substrate 10 is dipped in a plating solution 36 mainly containing nickel sulfate hexahydrate (at a temperature of 80° C.) for about 1 minute-3 minutes, to form a nickel layer having a thickness of about 0.1-0.2 µm. Alternatively, the substrate 10 may be dipped in a plating solution mainly containing nickel chloride hexahydrate (at a temperature of 60° C.) for about 3 minutes-10 minutes, to form a nickel layer having a thickness of about 0.1-0.2 µm. According to the present example, because the catalyst 30 is provided along the first area 12, the metal layer 34 can be selectively formed along the first area 12 of the substrate 10 even without forming a mask with a resist layer or the like.

In accordance with the present example, the surface-active agent 18 is patterned by irradiating the vacuum ultraviolet radiation 22, and the catalyst 30 is provided on the surface-active agent 18. As a result, the metal layer 34 can be deposited only on required portions along a predetermined pattern configuration. Therefore, for example, there is no need to form a mask with a resist layer or the like, and a waste of material can be reduced, and wirings can be formed at a low cost in high accuracy, with a simple and short-time manufacturing process.

It is noted that, in the above-described process, both of a wet-etching step with an alkali and a wet-etching step with an acid are conducted, but only one of the steps may be conducted. Even in such a case, wirings can be patterned in higher accuracy.

Second Example of First Embodiment

FIG. 5(A) and FIG. 5(B) are views indicating a second example of the present embodiment. In the present example, after a surface-active agent 18 is provided on the first area 12 as indicated in FIG. 3(A)-FIG. 3(D), a catalyst 38 is provided on the second area 14 of the substrate 10. In other words, the catalyst 38 is provided in the second area 14 among the surface of the substrate 10 which is exposed through the surface-active agent 18. In the present example, the second area 14 is an area where metal layers (wirings) are formed, and has a predetermined pattern configuration.

For example, the substrate 10 is dipped in a solution including tin chloride having a positive charge, and then dipped in a catalyst liquid including palladium chloride, whereby palladium can be precipitated to the second area 14 (portion having a negative potential) of the substrate 10. It is noted that the substrate 10 may be dipped in the catalyst liquid for 1 minute-5 minutes, and then washed with pure water.

Next, wet-etching with an acid may also be conducted in the present example. Its details include contents that can be derived from the descriptions given above. However, in the present example, because the catalyst 38 is patterned to be remained in the second area 14, residues of the catalyst 38 generated on the surface-active agent 18 are removed.

Then, as indicated in FIG. 5(B), a metal layer 40 is precipitated to the catalyst 38. Because the catalyst 38 is provided in the second area 14, the metal layer 40 can be formed in a pattern configuration along the second area 14.

It is noted that the details described above in the aforementioned example can be applied to other details of the present example.

Second Embodiment

FIG. 8(A)-FIG. 12(B) are views indicating a method for manufacturing a wiring substrate in accordance with a second embodiment of the present invention. In the present embodiment, a surface-active agent is patterned by using a droplet discharge method.

First Example of Second Embodiment

FIG. 8(A)-FIG. 9(B) are views for describing steps of an electroless plating method, and FIG. 10(A)-FIG. 11(B) are views schematically illustrating a substrate in each of the steps of the electroless plating method.

As shown in FIG. 10(A), a substrate 10 whose surface potential is a negative potential is prepared. The substrate 10 may be dipped in an alkaline solution (for example, an inorganic alkaline solution) 62 to thereby conduct an alkali washing, as indicated in FIG. 8(A). By so doing, nonuniformity of the surface potential of the first and second areas 12 and 14 of the substrate 10 can be made uniform into a negative potential. Details of the alkali washing steps are the same as those described in the first example of the first embodiment.

As shown in FIG. 8(B) and FIG. 10(C), a droplet discharge method is used to provide a surface-active agent 64 in the first area 12 of the substrate 10. More specifically, droplets (of the surface-active agent 64) are discharged from a droplet discharge section 66 directly to the surface of the substrate 10 in a predetermined pattern configuration. By this, because the surface-active agent 64 can be selectively provided, and there is no need to form a mask with a resist layer or the like, the manufacturing process is simple. Each droplet may include at least in part the surface-active agent 64, for example, include the surface-active agent 64 at its core, and its surface may be coated with a resin (adhesive material) or the like. Alternatively, each droplet may be formed solely from the surface-active agent 64. The droplet discharge method may be an ink jet method, or a dispenser coating method, and is not limited as long as it has a configuration to discharge droplets. According to the ink jet method, the technology that has been put in practice for ink jet printers can be applied, and ink (the surface-active agent 64) can be economically provided at high speeds without a waste. As an ink jet head, a piezoelectric type using piezoelectric elements, a bubble jet (registered trademark) type using an electro-thermal converter as an energy generation element, or the like can be used.

In the present example, the surface-active agent 64 has a property to cationize. As the surface-active agent 64, a cationic system surface-active agent may be used. In the present example, the surface potential of the first and second areas 12 and 14 of the substrate 10 is a negative potential, such that the use of a cationic system surface-active agent makes the surface potential of the substrate 10 to be in a neutral state or a positive potential in the first area 12, and a negative potential in the second area 14.

Next, wet-etching with an alkali may be conducted, to thereby remove residues of the surface-active agent 64 generated in the second area 14. Its details include contents that can be derived from the descriptions given above in the first embodiment.

As shown in FIG. 9(A) and FIG. 11(A), a catalyst 68 is provided in the second area 14 of the substrate 10. In other words, the catalyst 68 is provided in the second area 14 on the substrate 10 which is exposed through the surface-active agent 64. In the present example, the second area 14 is an area where a metal layer (wiring) is formed, and has a predetermined pattern configuration. To obtain the catalyst, the substrate 10 may be dipped in a solution including tin chloride, and then dipped in a catalyst liquid 70 including palladium chloride. Concretely, the details thereof are the same as those described in the second example of the first embodiment.

Next, wet-etching with an acid may be conducted, to thereby remove residues of the catalyst 68 generated on the surface-active agent 64. Its details include contents that can be derived from the descriptions given above in the first embodiment.

Then, as shown in FIG. 9(B) and FIG. 11(B), a metal layer 72 is precipitated to the catalyst 68. Because the catalyst 68 is provided in the second area 14, the metal layer 72 can be formed in a pattern configuration along the second area 14. It is noted that the precipitation of a metal layer may be conducted through dipping the substrate 10 in an electroless plating liquid 74, as shown in FIG. 9(B), more specifically, in a manner described above in the first example of the first embodiment.

In accordance with the present example, the surface-active agent 64 is patterned by using a droplet discharge method, and the catalyst 68 is provided while avoiding the surface-active agent 64. By this, the metal layer 72 can be deposited only to a required portion along a predetermined pattern configuration. For this reason, for example, there is no need to form a mask with a resist layer or the like, and a waste of material can be reduced, and wirings can be formed at a low cost in high accuracy, with a simple and short-time manufacturing process.

It is noted that the details described above in the aforementioned embodiment can be applied to other details of the present example.

Second Example of Second Embodiment

FIG. 12(A) and FIG. 12(B) are views indicating a second example of the present embodiment. According to the present example, after a surface-active agent 64 has been discharged by a droplet discharge method, as indicated in FIG. 10(A)-FIG. 10(C), a catalyst 76 is provided on the surface-active agent 64. Because the surface-active agent 64 is provided in the first area 12, the catalyst 68 is also provided in the first area 12. In the present example, the first area 12 is an area where a metal layer (wiring) is formed, and has a predetermined pattern configuration. In the present example, the (cationic system) surface-active agent 64 makes the surface potential of the substrate 10 to be in a neutral state or a positive potential in the first area 12, and a negative potential in the second area 14 because the surface of the substrate 10 is exposed. To obtain the catalyst, the substrate 10 may be dipped in a catalyst liquid including tin-palladium. The details thereof are the same as those described in the first example of the first embodiment.

Next, wet-etching with an acid may also be conducted in the present example. Its details include contents that can be derived from the descriptions given above. However, in the present example, because the catalyst 76 is patterned to be remained on the surface-active agent 64, residues of the catalyst 76 generated in the second area 14 are removed by wet-etching.

Then, as indicated in FIG. 12(B), a metal layer 78 is precipitated to the catalyst 76. Because the catalyst 76 is provided on the first area 12, the metal layer 78 can be formed in a pattern configuration along the first area 12.

It is noted that the details described above in the aforementioned example can be applied to other details of the present example.

Figure 13:
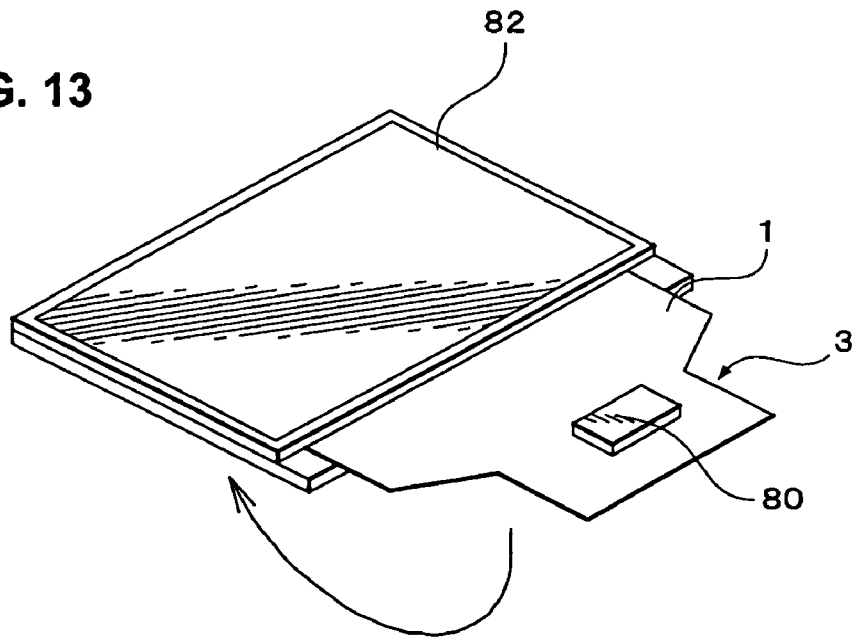
FIG. 13 is a view illustrating an electronic device in accordance with an embodiment of the present invention.

FIG. 13 is a view for describing a method for manufacturing an electronic device in accordance with an embodiment of the present invention, and more particularly, shows an example of an electronic device having a wiring substrate.

A metal layer (omitted in FIG. 13) having a predetermined pattern configuration is formed in a wiring substrate 1. A semiconductor chip 80 having an integrated circuit may be mounted (for example, face-down mounted) on the wiring substrate 1. The semiconductor chip 80 (integrated circuit) is electrically connected to the metal layer. In this manner, a semiconductor device 3 including the semiconductor chip 80 and the wiring substrate 1 may be manufactured. Then, the wiring substrate 1 (or, the semiconductor device 3) is electrically connected to a circuit board 82. In this manner, the electronic device can be manufactured. It is noted that the wiring substrate 1 may be bent, as indicated by an arrow in FIG. 13.

When the circuit board 82 is an electrooptic panel, the electronic device is an electrooptic device. The electrooptic device may be a liquid crystal device, a plasma display device, an electroluminescence display device, or the like. In accordance with the present embodiment, a waste of material can be reduced, and wirings can be formed at a low cost in high accuracy, with a simple and short-time manufacturing process.

Third Embodiment

Figure 14:
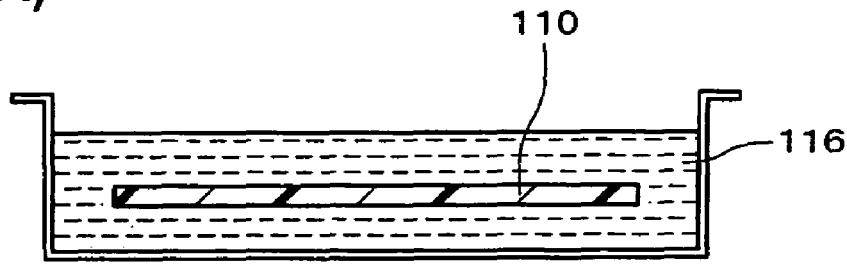
FIG. 14(A)-FIG. 14(C) are views illustrating a third embodiment of the present invention.
Figure 14:
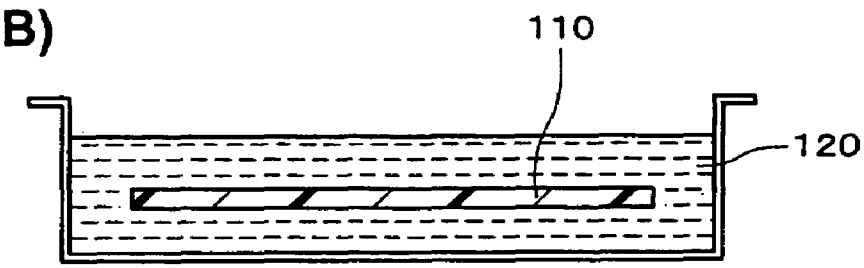
Figure 14:
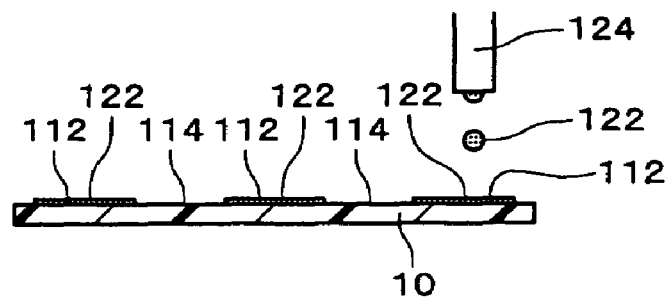
Figure 15:
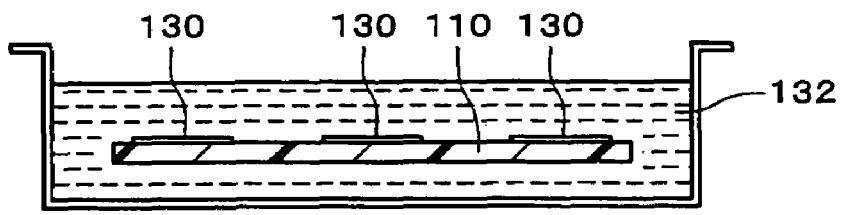
FIG. 15(A) and FIG. 15(B) are views illustrating the third embodiment of the present invention.
Figure 15:
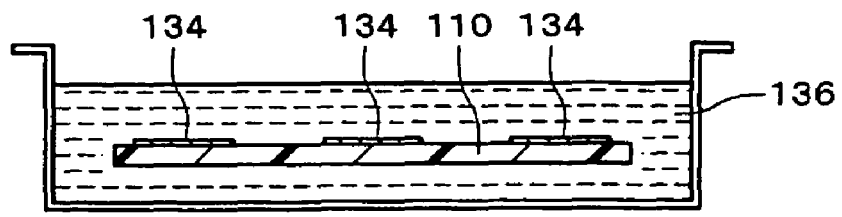

FIG. 14(A)-FIG. 19(B) are views indicating a method for manufacturing a wiring substrate in accordance with a third embodiment of the present invention. In the present embodiment, a wiring substrate is manufactured using an electroless plating method. FIG. 14(A)-FIG. 15 (B) are views for describing steps of the electroless plating method, and FIG. 17(A)-FIG. 18(B) are views schematically illustrating a substrate in each of the steps of the electroless plating method.

A substrate (sheet) 110 may be a flexible substrate. As the flexible substrate, a FPC (Flexible Printed Circuit), a COF (Chip On Film) substrate, or a TAB (Tape Automated Bonding) substrate may be used. The substrate 110 is formed from an organic material (for example, resin). As the substrate 110, a polyimide substrate or a polyester substrate may be used. The substrate 110 has organic interatomic bonds. The substrate 110 may have at least one of C—C, C═C, C—F, C—H, C—Cl, C—N, C—O, N—H and O—H bonds. The substrate 110 may have at least C═C bonds. In the present embodiment, a wiring is formed on one of surfaces of the substrate 110. Alternatively, wirings may be formed on both of the surfaces of the substrate 110. The substrate 110 has first and second areas 112 and 114 (see FIG. 14(C) and FIG. 17(C)). The first and second areas 112 and 114 are areas in the surface of the substrate 110 where wirings are formed.

As a modified example, the substrate 110 may be composed of an inorganic material (for example, a glass substrate or a ceramic substrate), or may be composed of organic system and inorganic system compound material (for example glass epoxy substrate).

As shown in FIG. 14(A) and FIG. 17(A), first, dirt on the surface of the substrate 110 may be washed (cleaned). As a washing method, the substrate 110 may be dipped in a washing solution 116 such as an acid, an alkali, an organic solvent or water. Concretely, a solution of hydrochloride system or an alcohol such as IPA or the like may be used as the washing solution 116. In the case of organic system material, the surface potential (surface potential in a liquid) of the substrate 110 is often a negative potential, as shown in FIG. 17(A). Alternatively, a substrate with its surface potential being a positive potential can be used as the substrate 110. If needed, a surface roughening treatment may be applied to the substrate 110. By conducting the cleaning and surface roughening treatments, the adhesion of a metal layer (wiring) can be improved.

As shown in FIG. 14(B) and FIG. 17(B), a first surface-active agent 118 is provided in the first and second areas 112 and 114 of the substrate 110. The surface-active agent 118 may be provided over the entire area of one of the surfaces of the substrate 110. In accordance with the present embodiment, the first surface-active agent 118 has a property to cationize. As the surface-active agent 118, a cationic system surface-active agent (a cation surface-active agent or one having a property equal to the same) may be used. When the surface potential of the substrate 110 is a negative potential, the negative potential on the surface of the substrate 110 can be neutralized or reversed to a positive potential by the cationic system surface-active agent used. On the other hand, when the surface potential of the substrate 110 is a positive potential, the use of the cationic system surface-active agent can improve potential nonuniformity caused by dirt or the like on the surface of the substrate 110, and form a stable positive potential surface.

In the example shown in FIG. 14(B), the substrate 110 is dipped in a surface-active agent solution 120. More specifically, the substrate 110 is dipped in a cation surface-active agent solution of an alkyl chloride system at room temperature for about 30 seconds to 3 minutes, and then washed with pure water. Then, the substrate 110 is placed in a room temperature atmosphere, and is sufficiently dried.

As shown in FIG. 14(C) and FIG. 17(C), a second surface-active agent 122 is provided in the first area 112 of the substrate 110. The second surface-active agent 122 is not provided in the second area 114. The second surface-active agent 122 does not have to be adhered to the second area 114 at all in the manufacturing process. As a result, a removal step, that may be needed when the second surface-active agent 122 is adhered to the second area 114, can be omitted, such that the manufacturing process can be simplified. Also, the first surface-active agent 118 can be prevented from being removed together, which would happen if the second surface-active agent 122 were removed from the second area 114. Accordingly, the first surface-active agent 118 can be securely left, such that a potential difference can be made clearer by the first and second surface-active agents 118 and 122, as described below, and the catalyst can be more securely, selectively provided.

It is noted that the second surface-active agent 122 may be displaced from the first surface-active agent 118 (see FIG. 17(C)), or may be laminated over the first surface-active agent 118. The second surface-active agent 122 is disposed on the uppermost surface in the first area 112.

In the present embodiment, the first area 112 is an area where a metal layer (wiring) is formed, and has a predetermined pattern configuration. The second area 114 has a reversed configuration of the first area 112 in the surface of the substrate 110.

In accordance with the present embodiment, the second surface-active agent 122 has a property to anionize. As the second surface-active agent 122, an anionic system surface-active agent (an anionic surface-active agent or one having a property equal to the same) may be used. In this case, the surface potential of the substrate 110 is made to be in a neutral state or a negative potential in the first area 112, and a positive potential in the second area 114.

In the example shown in FIG. 14(C), the second surface-active agent 122 is selectively provided by using a droplet discharge method. More specifically, droplets (of the second surface-active agent 122) are jetted from a droplet discharge section 124 directly to the surface of the substrate 110 in a predetermined pattern configuration. By this, because the second surface-active agent 122 can be selectively provided, and there is no need to form a mask with a resist layer or the like, the manufacturing process is simple. Each droplet may include at least in part the second surface-active agent 122, for example, include the second surface-active agent 122 at its core, and its surface may be coated with a resin (adhesive material). Alternatively, each droplet may be formed solely from the second surface-active agent 122. The droplet discharge method may be an ink jet method, or a dispenser coating method, and is not limited as long as it has a configuration to jet droplets. According to the ink jet method, the technology that has been put in practice for ink jet printers can be applied, and ink (the second surface-active agent 122) can be economically provided at a high speed without a waste. As an ink jet head, a piezoelectric type using piezoelectric elements, a bubble jet (registered trademark) type using an electro-thermal converter as an energy generation element, or the like can be used.

Figure 16:
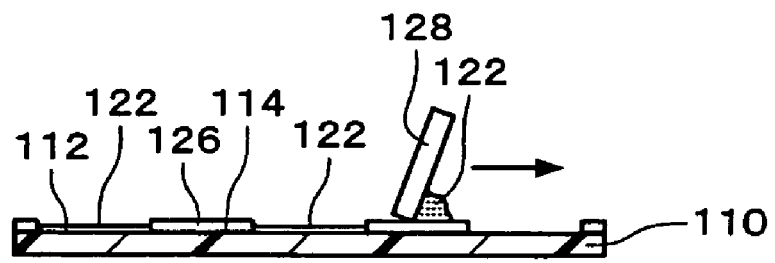
FIG. 16 is a view illustrating the third embodiment of the present invention.
Figure 17:
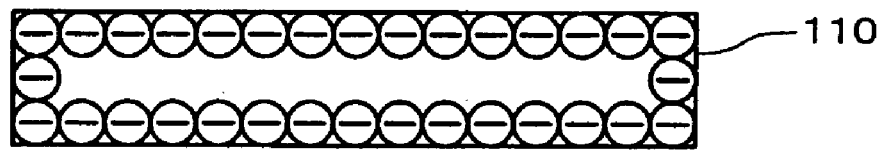
FIG. 17(A)-FIG. 17(C) are views illustrating the third embodiment of the present invention.
Figure 17:
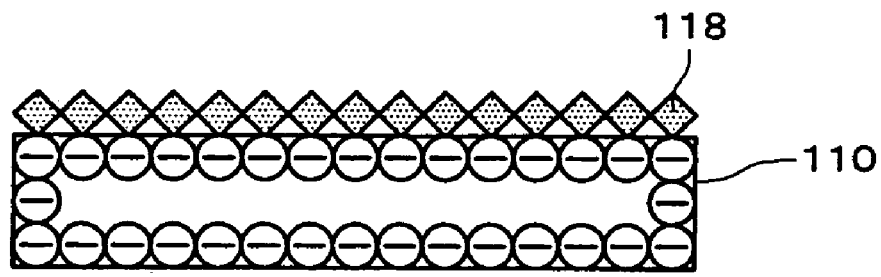
Figure 17:
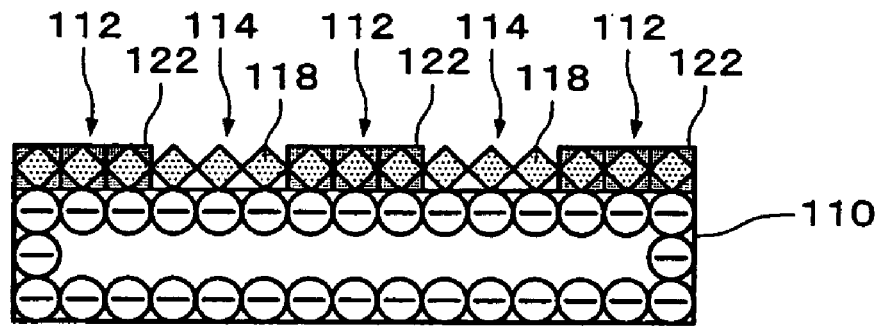
Figure 18:
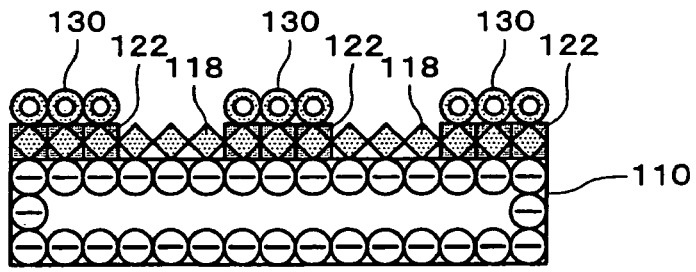
FIG. 18(A) and FIG. 18(B) are views illustrating the third embodiment of the present invention.
Figure 18:
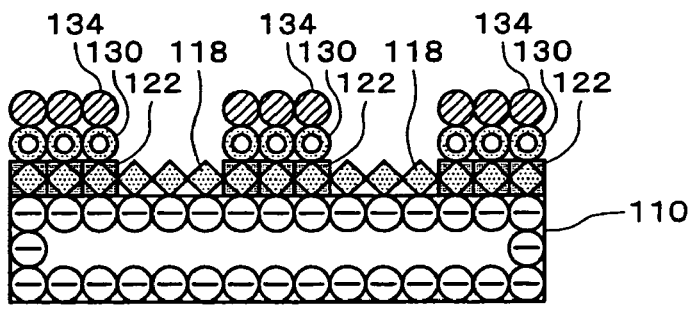
Figure 19:
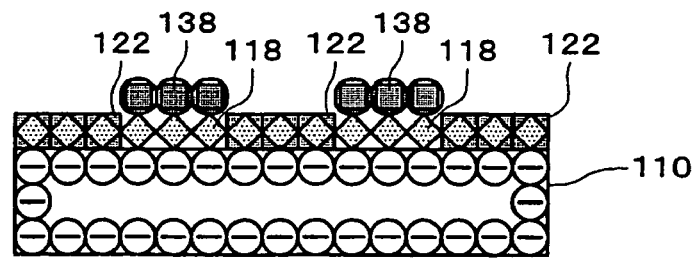
FIG. 19(A) and FIG. 19(B) are views illustrating the third embodiment of the present invention.
Figure 19:
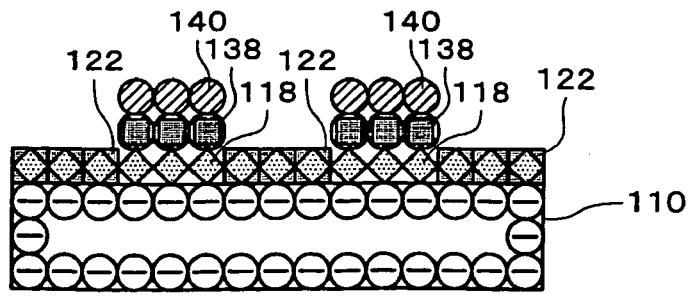
Figure 20:
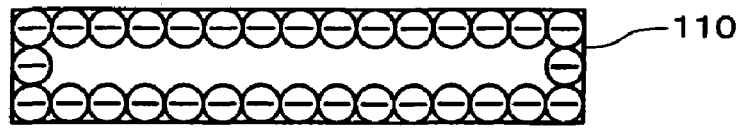
FIG. 20(A)-FIG. 20(C) are views illustrating a fourth embodiment of the present invention.
Figure 20:
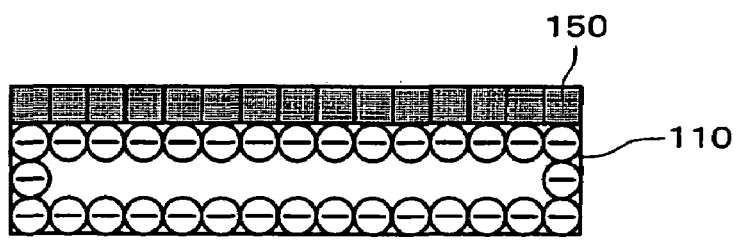
Figure 20:
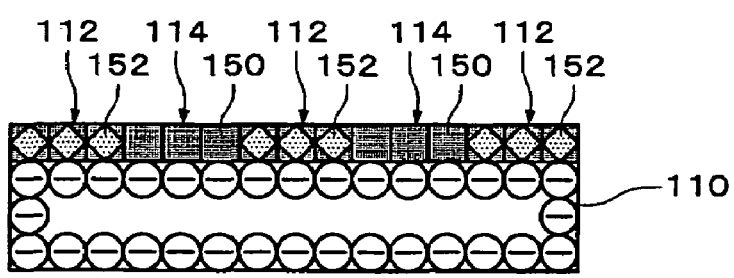
Figure 21:
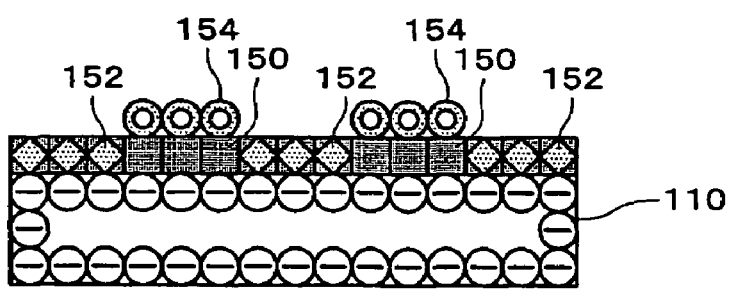
FIG. 21(A) and FIG. 21(B) are views illustrating the fourth embodiment of the present invention.
Figure 21:
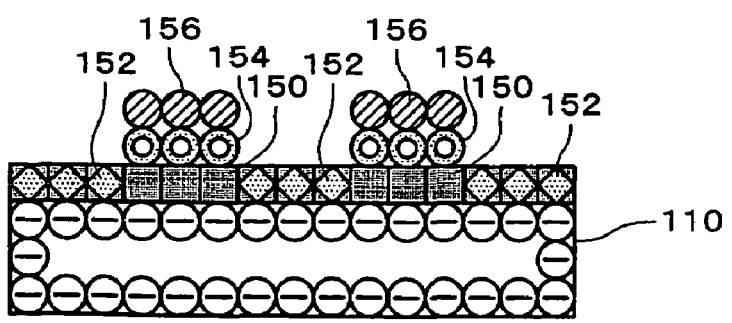
Figure 22:
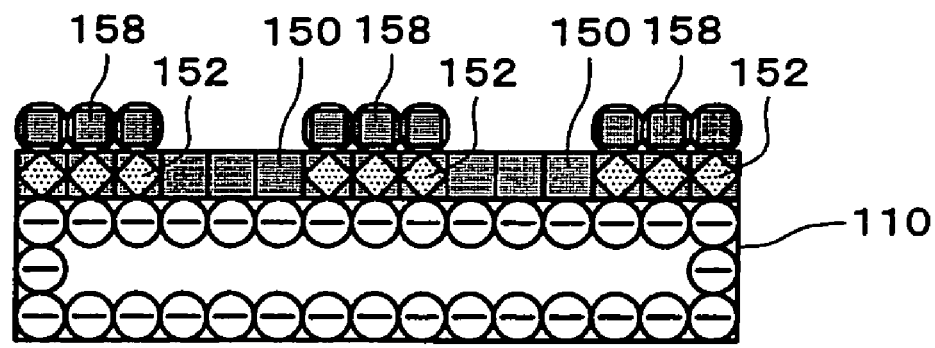
FIG. 22(A) and FIG. 22(B) are views illustrating the fourth embodiment of the present invention.
Figure 22:
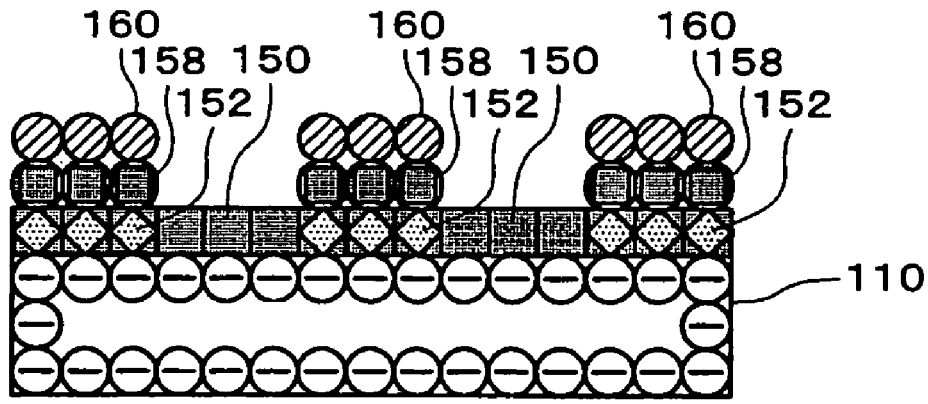
Figure 23:
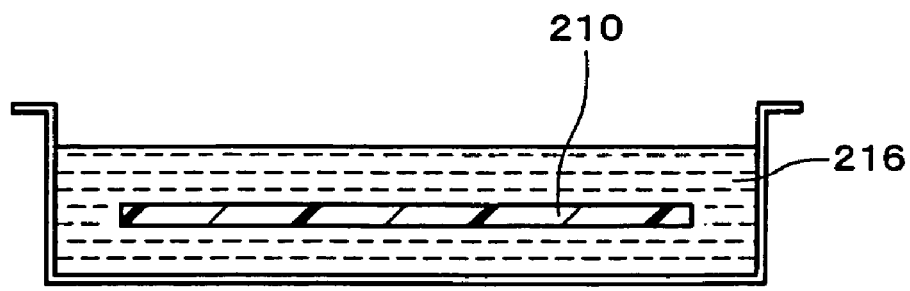
FIG. 23(A)-FIG. 23(C) are views illustrating a fifth embodiment of the present invention.
Figure 23:
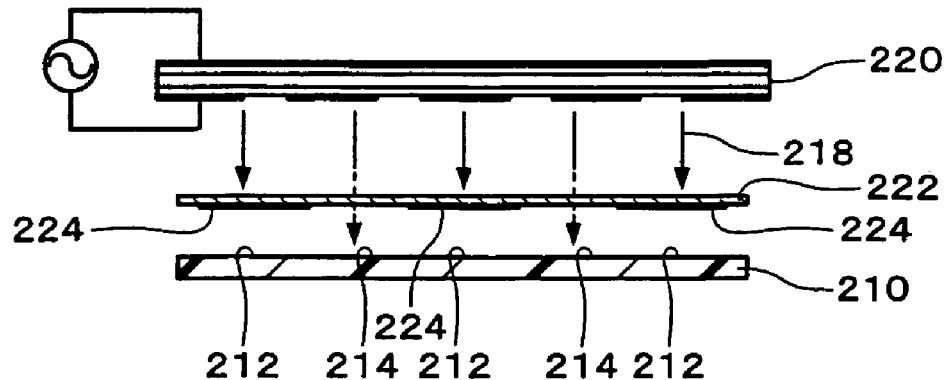
Figure 23:
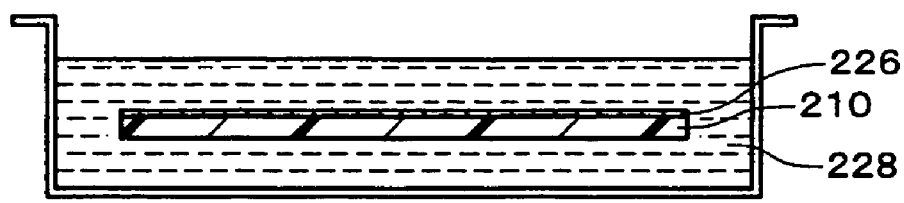
Figure 24:
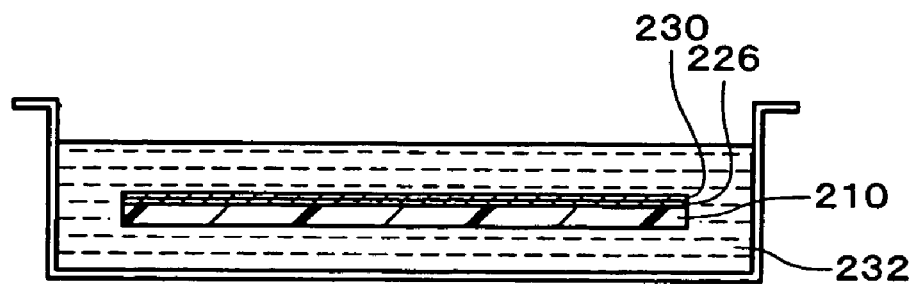
FIG. 24(A)-FIG. 24(C) are views illustrating the fifth embodiment of the present invention.
Figure 24:
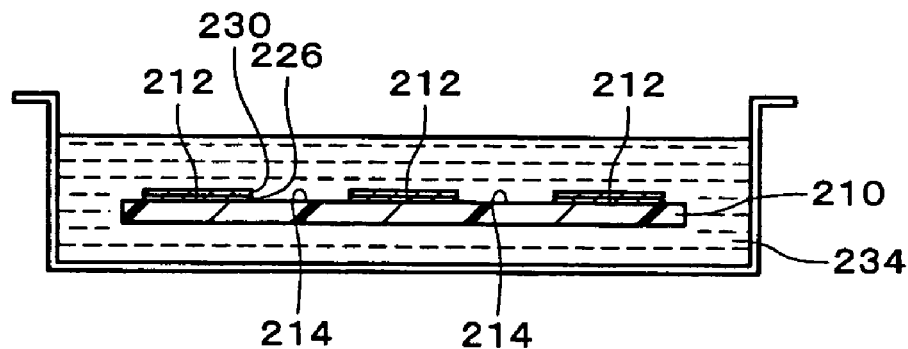
Figure 24:
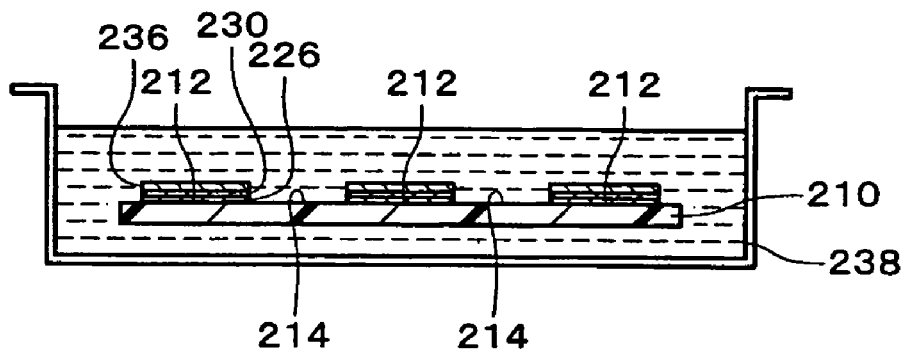

In accordance with a modified example, as shown in FIG. 16, a print method (for example, a screen print method) may be applied, whereby the second surface-active agent 122 may be selectively provided. More specifically, a mask 126 having an opening in a portion overlapping the first area 112 is disposed on the substrate 110, and ink (the second surface-active agent 122) on the mask 126 is spread by a squeegee 128, to fill the ink in the opening in the mask 126. It is noted that the means to selectively provide the second surface-active agent 122 is not limited to those described above.

A catalyst (plating catalyst) 130 is provided on the second surface-active agent 122, as shown in FIG. 15(A) and FIG. 18(A). The catalyst 130 causes precipitation of a metal layer (plating layer) in an electroless plating liquid, and may be, for example, palladium. A resin for bonding may not be included in the catalyst 130.

In the example shown in FIG. 15(A), the substrate 110 is dipped in a solution including tin chloride having a positive charge, and then dipped in a catalyst liquid 132 including palladium chloride. Thus, palladium can be precipitated to the second surface-active agent 122 (the anionic system surface-active agent). It is noted that the substrate 110 may be dipped in the catalyst liquid 132 for 1 minute-5 minutes, and then washed with pure water.

Next, wet-etching with an acid is conducted, to remove residues of the catalyst 130 generated on the first surface-active agent 118. Its details contain contents that can be derived from the description made above in the first embodiment.

As shown in FIG. 15(B) and FIG. 18(B), a metal layer 134 is deposited on the catalyst 130. Because the catalyst 130 is provided on the second surface-active agent 122, and the second surface-active agent 122 is exposed along the first area 112, the metal layer 134 can be formed in a pattern configuration along the first area 112. The metal layer 134 may be formed with one layer, or may be formed with multiple layers. The material of the metal layer 134 is not limited, and may be, for example, any one of Ni, Au, Ni+Au, Cu, Ni+Cu and Ni+Au+Cu. A catalyst may be selected according to the material of the metal layer 134 to be deposited.

In the example shown in FIG. 15(B), the substrate 110 is dipped in a plating solution 136 mainly containing nickel sulfate hexahydrate (at a temperature of 80° C.) for about 1 minute-3 minutes, to form a nickel layer having a thickness of about 0.1-0.2 μm. Alternatively, the substrate 110 may be dipped in a plating solution mainly containing nickel chloride hexahydrate (at a temperature of 60° C.) for about 3 minutes-10 minutes, to form a nickel layer having a thickness of about 0.1-0.2 μm. According to the present embodiment, because the catalyst 130 is provided along the first area 112, the metal layer 134 can be selectively formed along the first area 112 of the substrate 110 even without forming a mask with a resist layer or the like.

In this manner, a wiring composed of the metal layer 134 can be formed along the first area 112. A wiring substrate in accordance with the present embodiment includes the substrate 110 and the metal layer (wiring) 134. A plurality of wirings may be formed on the substrate 110, to thereby form one wiring pattern.

According to the present embodiment, the surface-active agent is formed into a two-layer structure (including a laminated or displaced configuration), such that the catalysis 130 is selectively provided on either of the surface-active agent layers. By this, the metal layer 134 can be precipitated only to required portions along a predetermined pattern configuration. Accordingly, for example, there is no need to form a mask with a resist layer or the like, and a waste of material can be reduced, and highly accurate wirings can be formed at a low cost with a simple and short-time manufacturing process.

FIG. 19(A) and FIG. 19(B) are views illustrating a modified example of the present embodiment. According to the present modified example, after first and second surface-active agents 118 and 122 have been provided, as indicated in FIG. 17(A)-FIG. 17(C), a catalyst 138 is provided on the first surface-active agent 118. In other words, the catalyst 138 is provided on the first surface-active agent 118 in portions exposed through the second surface-active agent 122 (portions corresponding to the second area 114 (see FIG. 17(C)). In the present modified example, the second area 114 is an area where a metal layer (wiring) is formed, and has a predetermined pattern configuration.

For example, the substrate 110 is dipped in a catalyst liquid containing tin-palladium. More specifically, the substrate 110 is dipped in a tin-palladium colloidal catalyst liquid of approximately PH1 for 130 seconds-3 minutes at room temperature, and then sufficiently washed with clear water. Tin-palladium colloidal particles have a negative charge, and are adsorbed to the first surface-active agent 118 (cationic system surface-active agent). Then, the substrate 110 is dipped in a solution including a fluoroborate acid at room temperature for 30 seconds-3 minutes for activation of the catalyst, and then washed with clear water. As a result, the tin colloidal particles are removed, and palladium alone can be precipitated on the first surface-active agent 118 (cationic system surface-active agent).

Next, wet-etching with an acid may also be conducted in the present example. Its details include contents that can be derived from the descriptions given above. However, in the present example, because the catalyst 138 is patterned to be remained on the first surface-active agent 118, residues of the catalyst 138 generated on the second surface-active agent 122 are removed by wet-etching.

Then, as shown in FIG. 19(B), a metal layer 140 is precipitated on the catalyst 138. Because the catalyst 138 is provided on the first surface-active agent 118, and the first surface-active agent 118 is exposed along the second area 114, the metal layer 140 can be formed in a pattern configuration along the second area 114. The details described above can be applied to the method for forming the metal layer.

Fourth Embodiment

FIG. 20(A)-FIG. 22(B) are views indicating a method for manufacturing a wiring substrate in accordance with a fourth embodiment of the present invention.

As shown in FIG. 20(A), a substrate 110 is prepared, and a first surface-active agent 150 is provided in first and second areas (see FIG. 20(C)) of the substrate 110 as shown in FIG. 20(B). The first surface-active agent 150 may be provided over the entire area of one of the surfaces of the substrate 110. In the present embodiment, the first surface-active agent 150 has a property to anionize. As the first surface-active agent 150, an anionic system surface-active agent may be used. When the surface potential of the substrate 110 is a positive potential, the positive potential of the surface of the substrate 110 can be neutralized or reversed to a negative potential by the anionic system surface-active agent used. Also, when the surface potential of the substrate 110 is a negative potential, the use of the anionic system surface-active agent can improve potential nonuniformity caused by dirt or the like on the surface of the substrate 110, and form a stable negative potential surface.

More specifically, the substrate 110 is dipped in an anionic surface-active agent solution at room temperature for about 30 seconds-3 minutes, and then washed with pure water. Then, the substrate 110 is sufficiently dried in a room temperature atmosphere.

As shown in FIG. 20(C), a second surface-active agent 152 is provided in the first area 112 of the substrate 110. Details of steps to provide the second surface-active agent 152 may be the same as those described above in the third embodiment, and a droplet discharge method (for example, an ink jet method) may be applied, or a print method (for example, a screen print method) may be applied. However, in accordance with the present embodiment, the second surface-active agent 152 has a property to cationize. As the second surface-active agent 152, a cationic system surface-active agent may be used. In this case, the surface potential of the substrate 110 is made to be in a neutral state or a positive potential in the first area 112, and a negative potential in the second area 114.

A catalyst 154 is provided on the first surface-active agent 150, as shown in FIG. 21(A). The catalyst 154 is provided on the first surface-active agent 150 in portions exposed through the second surface-active agent 152 (portions corresponding to the second area 114 (see FIG. 20(C)). In the present embodiment, the second area 114 is an area where a metal layer (wiring) is formed, and has a predetermined pattern configuration. To obtain the catalyst, the substrate 110 may be dipped in a solution including tin chloride, and then dipped in a catalyst liquid including palladium chloride. Details thereof are the same as those described in the third embodiment.

Next, wet-etching with an acid may be conducted, to remove residues of the catalyst 154 generated on the second surface-active agent 152. Its details contain contents that can be derived from the description made above in the first embodiment.

Then, as shown in FIG. 21(B), a metal layer 156 is precipitated to the catalyst 154. Because the catalyst 154 is provided on the first surface-active agent 150, and the first surface-active agent 150 is exposed along the second area 114, the metal layer 156 can be formed in a pattern configuration along the second area 114. Thus, a wiring composed of the metal layer 156 can be formed along the second area 114. The details described above in the third embodiment can be applied to the method for forming the metal layer.

FIG. 22(A) and FIG. 22(B) are views illustrating a modified example of the present embodiment. In the present modified example, after first and second surface-active agents 150 and 152 are provided, as indicated in FIG. 20(A)-FIG. 20(C), a catalyst 158 is provided on the second surface-active agent 152. In the present modified example, the first area 112 is an area where a metal layer (wiring) is formed, and has a predetermined pattern configuration. To obtain the catalyst, the substrate 110 may be dipped in a catalyst liquid including tin-palladium. Concretely, the details described in the modified example of the third embodiment are applied.

Next, wet-etching with an acid may be conducted, to remove residues of the catalyst 158 generated on the first surface-active agent 150. Its details contain contents that can be derived from the description made above in the first embodiment.

Then, as shown in FIG. 22(B), a metal layer 160 is precipitated to the catalyst 158. Because the catalyst 158 is provided on the second surface-active agent 152, and the second surface-active agent 152 is exposed along the first area 112, the metal layer 160 can be formed in a pattern configuration along the first area 112. The details of the method for forming the metal layer described above can be similarly applied. Other details and effects of the present embodiment (including its modified examples) are the same as those described in the third embodiment.

Fifth Embodiment

FIG. 23(A)-FIG. 28(C) are views indicating a method for manufacturing a wiring substrate in accordance with a fifth embodiment of the present invention. In the present embodiment, a wiring substrate is manufactured using an electroless plating method.

A substrate (sheet) 210 may be a flexible substrate. As the flexible substrate, a FPC (Flexible Printed Circuit), a COF (Chip On Film) substrate, or a TAB (Tape Automated Bonding) substrate may be used. The substrate 210 is formed from an organic material (for example, resin). As the substrate 210, a polyimide substrate or a polyester substrate may be used. The substrate 210 has organic interatomic bonds. The substrate 210 may have at least one of C—C, C═C, C—F, C—H, C—Cl, C—N, C—O, N—H and O—H bonds. The substrate 210 may have at least C═C bonds. In the present embodiment, a wiring is formed on one of surfaces of the substrate 210. Alternatively, wirings may be formed on both of the surfaces of the substrate 210. The substrate 210 has first and second areas 212 and 214 (see FIG. 23(B)). The first and second areas 212 and 214 are areas in the surface of the substrate 210 where wirings are formed.

As shown in FIG. 23(A), first, dirt on the surface of the substrate 210 may be washed (cleaned). As a washing method, the substrate 210 may be dipped in a washing solution 216 such as an acid, an alkali, an organic solvent or water. Concretely, a solution of hydrochloride system or an alcohol such as IPA or the like may be used as the washing solution 216.

The substrate 210 may be washed with an alkali by dipping in an alkaline solution (for example, an inorganic alkaline solution). More specifically, the substrate 210 may be dipped in or washed with a solution of sodium hydroxide with a concentration of 1 wt %-10 wt % at room temperature for about 10-60 minutes (for example, 30 minutes). Cleaning and surface roughening treatments can be applied to the substrate 210 at the same time by the alkali washing. As a result, the adhesion of a metal layer (wiring) can be improved.

As shown in FIG. 23(B), vacuum ultraviolet radiation (VUV; vacuum ultraviolet radiation) 218 is irradiated to the second area 214 of the substrate 210. More specifically, a mask 222 is disposed between a source of light 220 and the substrate 210, and the vacuum ultraviolet radiation 218 is irradiated to the substrate 210 through the mask 222. The vacuum ultraviolet radiation 218 is covered by a pattern 224 of the mask 222, and penetrates other areas. When the vacuum ultraviolet radiation 218 is irradiated, interatomic bonds in the second area 214 of the substrate 210 are (chemically) decomposed. In the present embodiment, the second area 214 of the substrate 210 is not mechanically cut. According to this method, the vacuum ultraviolet radiation 218 is used mainly for the action of decomposing the interatomic bonds of the substrate 210, such that its energy can be lowered compared with the case where the substrate 210 is cut. As a result, for example, distortion by heat can be prevented from being generated in the substrate 210. Moreover, parts of the substrate 210 can be prevented from dispersing and adhering to other parts.

It is noted here that, in the present embodiment, the first area 212 is an area where a metal layer (wiring) is formed, and has a predetermined pattern configuration. The second area 214 has a reversed configuration of the first area 212 in the surface of the substrate 210.

The vacuum ultraviolet radiation 218 may have a wavelength of 100 nm-200 nm (for example, 100 nm-180 nm). The vacuum ultraviolet radiation 218 has a property (for example, a wavelength) that can decompose organic interatomic bonds. The vacuum ultraviolet radiation 218 may have a property (for example, a wavelength) to decompose at least C═C bonds of the substrate 210. It may have a property (for example, a wavelength) that can decompose all of the interatomic bonds (at least one of C—C, C═C, C—F, C—H, C—Cl or C—N C—O, N—H and O—H bonds) of the substrate 210. An excimer lamp enclosing Xe gas therein may be used as the source of light 220 (with a wavelength of 172 nm). Because a condenser lens for laser generation and the scanning time with a laser become unnecessary if the lamp is used, simplification of the manufacturing process can be achieved.

More specifically, a mask 222 is arranged over a wiring forming surface of the substrate 210, as shown in FIG. 23(B). The mask 222 may be a photomask, or may be a metal mask. For example, a high-purity silica glass for vacuum ultraviolet radiation (with a transmittance of vacuum ultraviolet radiation of 80% or more) having a pattern formed with chrome is used as the mask 222. Although the mask 222 is shown to be spaced from and above the substrate 210 in FIG. 23(B), the mask 222 is actually disposed on and in contact with the substrate 210. The source of light 220, the mask 222, and the substrate 210 are disposed in a nitrogen atmosphere. The vacuum ultraviolet radiation 218 can be irradiated up to the distance of about 10 mm without attenuating in the nitrogen atmosphere.

When neither the substrate 210 nor the mask 222 comes in contact uniformly due to an elasticity and/or a warp of the substrate 210, an outer circumference portion of the mask 222 may be retained with a holder, and the back of the substrate 210 may be pressed toward the mask 222 side in an area of the same size as the mask 222. The source of light 220 is placed close to the substrate 210 as much as possible (for example, 10 mm or less). As the source of light 220, for example, an excimer VUV/03 Cleaning Unit (Manufacturer's name; Ushio Electric Co., Model; UER20-172A/B, and Lamp specification; Dielectric barrier discharge excimer lamp enclosing Xe gas therein) may be used. When the material of the substrate 210 consists of polyimide, the output is adjusted to about 10 mW and irradiation is conducted for about ten minutes. The vacuum ultraviolet radiation 218 is irradiated to one of the surfaces of the substrate 210 in the present embodiment. However, when wirings are to be formed on both sides of the substrate 210, the vacuum ultraviolet radiation 218 may be irradiated to each of the faces of the substrate 210 one by one or to both of them at the same time.

A surface active agent 226 may be provided in the first and second areas 212 and 214 of the substrate 210, if necessary, as shown in FIG. 23(C). In that case, the substrate 210 may be dipped in a surface-active agent solution 228. The surface-active agent 226 may be provided over the entire area of one of the surfaces of the substrate 210.

A cationic system surface-active agent (a cation surface-active agent or one having a property equal to the same) that has a property to cationize may be used as the surface-active agent 226. For example, the substrate 210 is dipped in a cation surface-active agent solution of an alkyl ammonium chloride system at room temperature for about 30 seconds to 3 minutes, and then washed with pure water. Then, the substrate 210 is sufficiently dried in a room temperature atmosphere. When the surface potential of the substrate 210 is a negative potential, the negative potential on the surface of the substrate 210 can be neutralized or reversed to a positive potential by the cationic system surface-active agent used.

As a modified example, an anionic system surface-active agent (an anionic surface-active agent or one having a property equal to the same) that has a property to anionize may be used as the surface-active agent 226. For example, the substrate 210 is dipped in an anionic surface-active agent solution at room temperature for about 30 seconds to 3 minutes, and then washed with pure water. Then, the substrate 210 is sufficiently dried in a room temperature atmosphere. When the surface potential of the substrate 210 is a negative potential, the use of the anionic system surface-active agent can improve potential nonuniformity caused by dirt or the like on the surface of the substrate 210, and form a stable negative potential surface.

A catalyst (plating catalyst) 230 is provided in the first and second areas 212 and 214 of the substrate 210, as shown in FIG. 24(A). In this case, the substrate 210 may be dipped in a catalyst liquid 232. When the surface-active agent 226 is provided in the first and second areas 212 and 214, the catalyst 230 is provided on the surface-active agent 226. Alternatively, the catalyst 230 may be provided on the surface of the substrate 210 without the surface-active agent 226. The catalyst 230 causes precipitation of a metal layer (plating layer) in an electroless plating liquid, and may be, for example, palladium. A resin for bonding may not be included in the catalyst 230.

For example, when the catalyst adhesion side is at a positive potential, the substrate 210 is dipped in a catalyst liquid including tin-palladium. More specifically, the substrate 210 is dipped in a tin-palladium colloidal catalyst liquid of approximately PH1 for 30 seconds-three minutes at room temperature, and then sufficiently washed with clear water. Tin-palladium colloidal particles have a negative charge, and adhere to the cationic system surface-active agent on the substrate 210. Then, the substrate 210 is dipped in a solution including a fluoroborate acid at room temperature for 30 seconds-3 minutes for activation of the catalyst, and then washed with clear water. As a result, the tin colloidal particles are removed, and palladium alone can be precipitated.

Alternatively, when the catalyst adhesion side is at a negative potential, for example, the substrate 210 may be dipped successively in a solution including tin chloride and a catalyst liquid including palladium chloride. More specifically, the substrate 210 may be dipped in a tin chloride (II) solution for 1-5 minutes, and then washed with pure water, further the substrate 210 may be dipped in a palladium chloride (II) solution as a catalyst liquid for 1-5 minutes, and then washed with pure water.

Besides the abovementioned method, the catalyst 230 may be provided in the first and second areas 212 and 214 of the substrate 210 by a dry film forming method (for example, by a sputter method or a vapor deposition method).

As shown in FIG. 24(B), the substrate 210 is washed (for example, by wet washing), whereby the catalyst 230 is patterned to be remained on the first area 212. By washing the substrate 210, portions of the substrate 210 where the interatomic bonds are decomposed by the vacuum ultraviolet radiation 218 may be removed. When the surface-active agent 226 is provided, the surface-active agent 226 and the catalyst 230 are both removed. As the washing method, the substrate 210 may be dipped in a washing solution 234, or a shower thereof may be jetted to the substrate 210. An alkaline solution (a strong alkaline solution or a weak alkaline solution) or pure water may be used as the washing solution 234. Shower washing with pure water or high-pressure jet washing with pure water may be employed as the shower method. Supersonic vibration may be added at the time of washing. In the example shown in FIG. 24(B), by conducting the washing, the catalyst 230 (and the surface-active agent 226) remains in the first area 212, and the surface of the substrate 210 (for example, a newly generated surface in which an upper part thereof is removed) is exposed in the second area 214. In this manner, patterning is conducted to leave the catalyst 230 along the first area 212.

Next, wet-etching with an acid is conducted, to remove residues of the catalyst 230 generated in the second area 214. Its details contain contents that can be derived from the description made above in the first embodiment.

A metal layer 236 is deposited to a portion of the catalyst 230 left in the first area 212, as shown in FIG. 24(C). Because the catalyst 230 has been removed in the second area 214, the metal layer 236 is not deposited to the second area 214. In this manner, the metal layer 236 can be formed in a pattern configuration along the first area 212. The metal layer 236 may be formed with one layer, or may be formed with multiple layers. The material of the metal layer 236 is not limited, and may be, for example, any one of Ni, Au, Ni+Au, Cu, Ni+Cu and Ni+Au+Cu. A catalyst may be selected according to the material of the metal layer 236 to be deposited.

In the example shown in FIG. 24(C), the substrate 210 is dipped in a plating solution 238 mainly containing nickel sulfate hexahydrate (at a temperature of 80° C.) for about 1 minute-3 minutes, to form a nickel layer having a thickness of about 0.1-0.2 μm. Alternatively, the substrate 210 may be dipped in a plating solution mainly containing nickel chloride hexahydrate (at a temperature of 60° C.) for about 3 minutes-10 minutes, to form a nickel layer having a thickness of about 0.1-0.2 μm. According to the present embodiment, because the catalyst 230 is provided along the first area 212, the metal layer 236 can be selectively formed along the first area 212 of the substrate 210 even without forming a mask with a resist layer or the like.

In this manner, a wiring composed of the metal layer 236 can be formed along the first area 212. A wiring substrate in accordance with the present embodiment includes the substrate 210 and the metal layer (wiring) 236. A plurality of wirings may be formed on the substrate 210, to thereby form one wiring pattern.

In accordance with the present embodiment, the catalyst 230 is patterned by irradiating the vacuum ultraviolet radiation 218. As a result, the metal layer 236 can be deposited only to a required portion along a predetermined pattern configuration. Therefore, for example, there is no need to form a mask with a resist layer or the like, and a waste of material can be reduced, and wirings can be formed at a low cost in high accuracy, with a simple and short-time manufacturing process.

Figure 25:
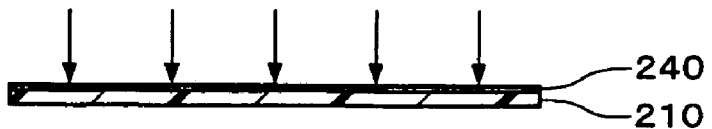
FIG. 25(A)-FIG. 25(D) are views illustrating the fifth embodiment of the present invention.
Figure 25:
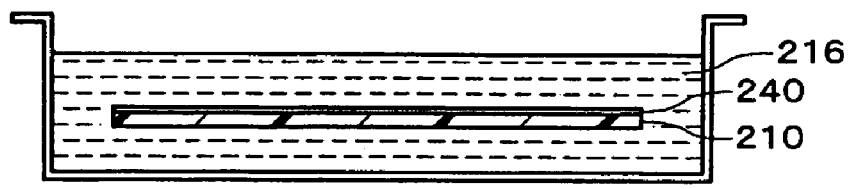
Figure 25:
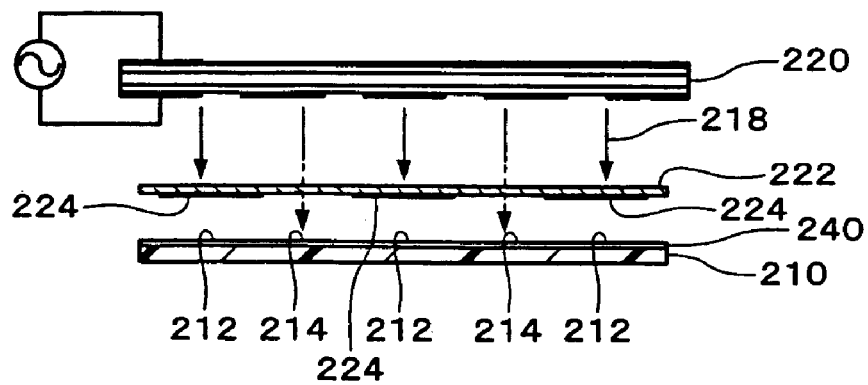
Figure 25:
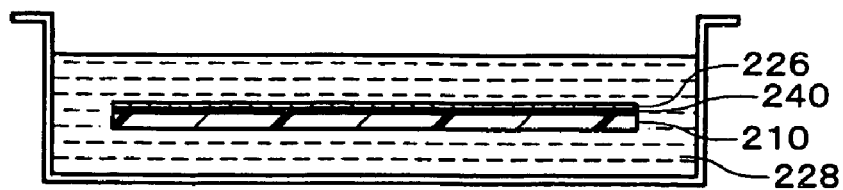
Figure 26:
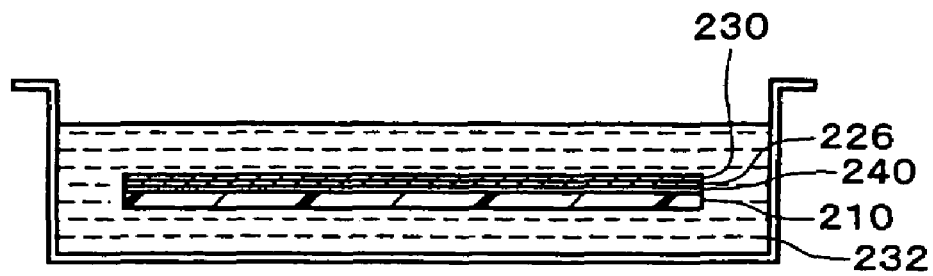
FIG. 26(A)-FIG. 26(C) are views illustrating the fifth embodiment of the present invention.
Figure 26:
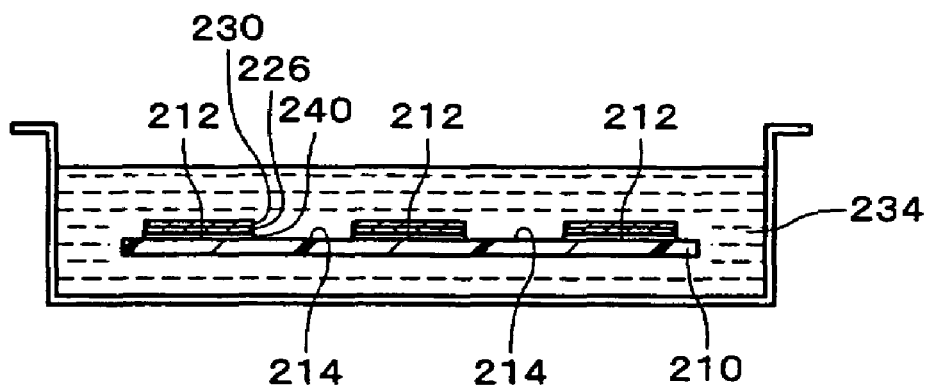
Figure 26:
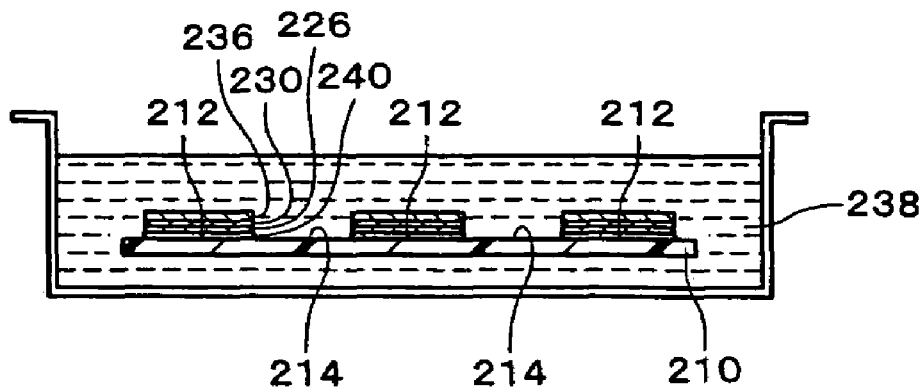

FIG. 25(A)-FIG. 26(C) are views illustrating a method of manufacturing a wiring substrate in accordance with a first modified example of the fifth embodiment of the present invention. In this modified example, a reforming layer (fluorinated layer) 240 including C—F bonds is formed to a substrate 210, as shown in FIG. 25(A). In other words, a fluorination treatment is applied to the substrate 210. The reforming layer 240 is formed in a surface layer portion on the side of first and second areas 212 and 214 of the substrate 210. The reforming layer 240 may be formed on the entire area of one of the surfaces of the substrate 210. For example, a plasma surface treatment may be applied to the substrate 210 by using a $CF_4$ gas. Though the thickness of the reforming layer 240 is not limited, it may be, for example, about 10 nm or less. Effects similar to the cleaning and surface roughening treatments of the substrate 210 described above can be achieved by forming the reforming layer 240. Moreover, the moisture resistance of the substrate 210 improves because the reforming layer 240 has a water-repelling function. Therefore, for example, even when it is kept for about one month in an indoor environment up to the catalyst formation process after irradiation of the vacuum ultraviolet radiation 218, the reproducibility of the pattern can be maintained.

Then, dirt on the surface of the substrate 210 may be further washed if necessary (see FIG. 25(B)), vacuum ultraviolet radiation 218 is irradiated to the substrate 210 (see FIG. 25(C)), a surface-active agent 226 is provided on a reforming layer 240 (see FIG. 25(D)), and a catalyst 230 is provided on the surface-active agent 226 (see FIG. 25(A)). Then, portions of the substrate 210 where the interatomic bonds are decomposed are removed by washing the substrate 210 (see FIG. 26(B)). Then, residues of the catalyst 230 generated in the second area 214 may be removed by wet-etching with an acid. In this manner, as shown in FIG. 26(C), a wiring can be formed along a predetermined pattern configuration (the first area 212) by depositing a metal layer 236 to portions where the catalyst 230 remains. The contents described above can be applied to details of the above.

Figure 27:
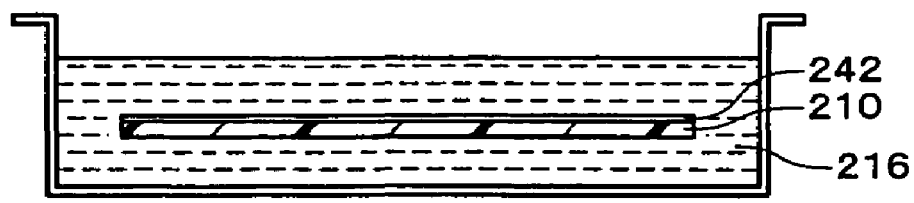
FIG. 27(A)-FIG. 27(C) are views illustrating the fifth embodiment of the present invention.
Figure 27:
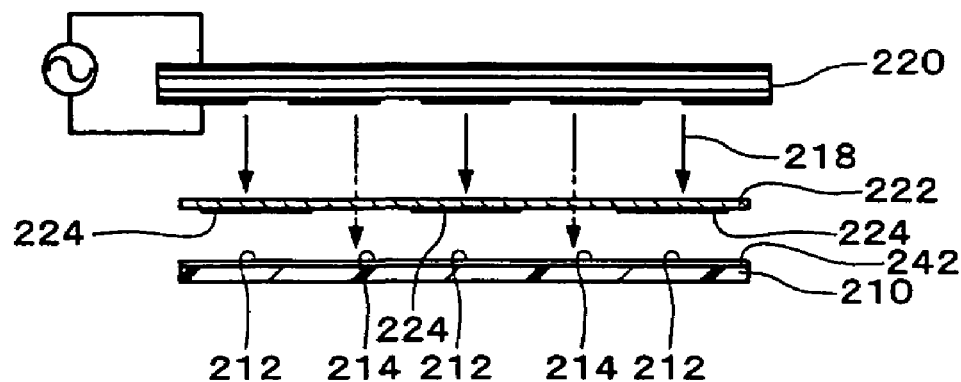
Figure 27:
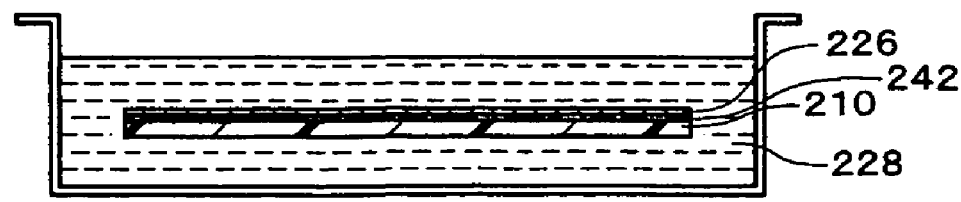
Figure 28:
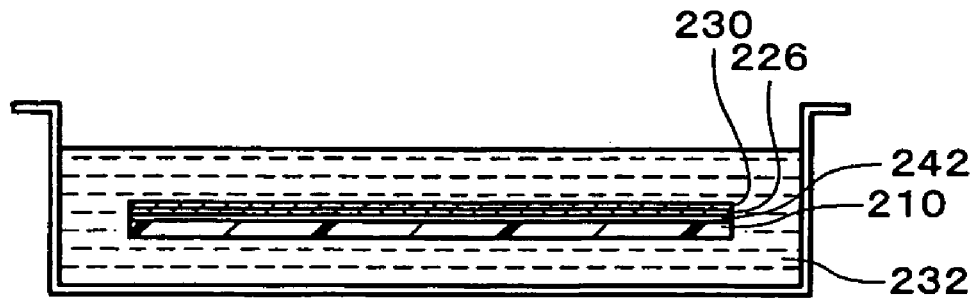
FIG. 28(A)-FIG. 28(C) are views illustrating the fifth embodiment of the present invention.
Figure 28:
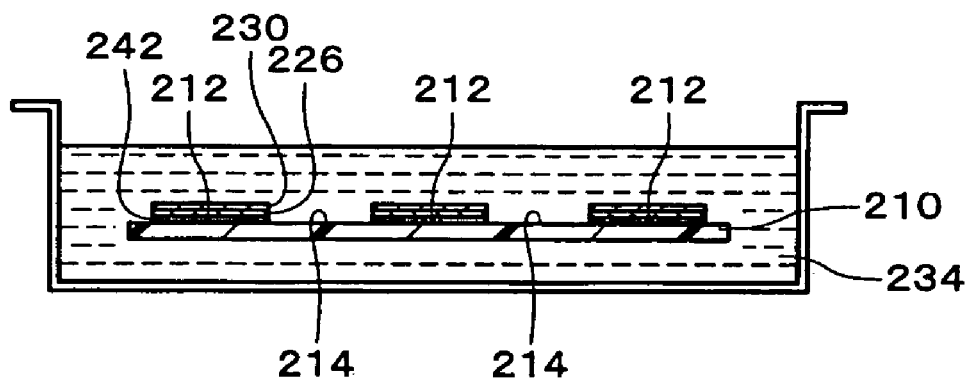
Figure 28:
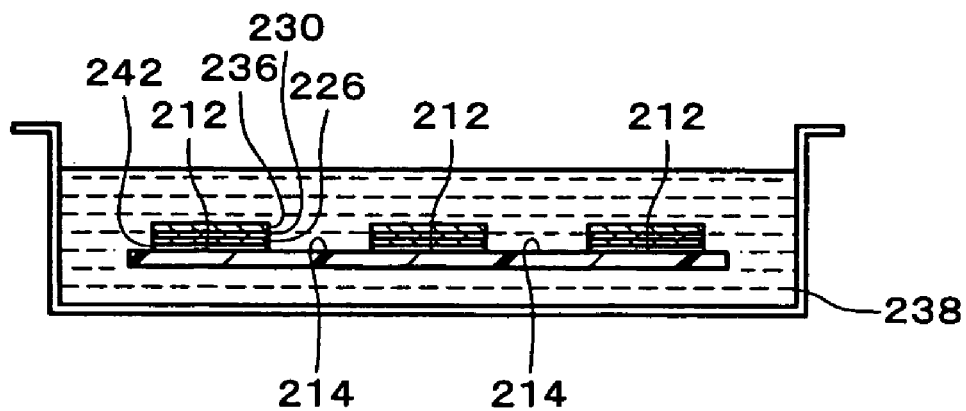

FIG. 27(A)-FIG. 28(C) are views illustrating a method of manufacturing a wiring substrate in accordance with a second modified example of the fifth embodiment of the present invention. In this modified example, a substrate 210 is washed with an alkali, to thereby form a hydrolyzed layer 242 to the substrate 210. The hydrolyzed layer 242 is formed in a surface layer portion on the side of first and second areas 212 and 214 of the substrate 210. Alkali washing may be conducted by dipping the substrate 210 in a washing solution 216 such as an alkaline solution (for example, an inorganic alkaline solution) or the like, as shown in FIG. 27(A). More specifically, the substrate 210 may be dipped in sodium hydroxide in a concentration of 10 wt %-20 wt % at room temperature for about 10 minutes-60 minutes, and washed with clear water. The thickness of the hydrolyzed layer 242 can be adjusted by various factors, such as, a liquid temperature and liquid concentration of the washing solution 216 that may be an alkaline solution, or the like, and the washing time. It is noted that cleaning and surface roughening treatments can be applied to the substrate 210 at the same time by the above-described alkali washing. By this, the adhesion of a metal layer (wiring) can be improved.

Then, vacuum ultraviolet radiation 218 is irradiated to the substrate 210 (see FIG. 27(B)), a surface-active agent 226 is provided on the hydrolyzed layer 242 (see FIG. 27(C)), and a catalyst 230 is provided on the surface-active agent 226 (see FIG. 28(A)). Then, portions of the substrate 210 where the interatomic bonds are decomposed are removed by washing the substrate 210 (see FIG. 28(B)). Then, residues of the catalyst 230 generated in the second area 214 may be removed by wet-etching with an acid. In this manner, a wiring can be formed along a predetermined pattern configuration (the first area 212) by depositing a metal layer 236 to portions where the catalyst 230 remains, as shown in FIG. 28(C). The contents described above can be applied to details of the above.

In the first and second modified examples, the vacuum ultraviolet radiation is injected into a portion (for example, 1 μm deep or less from the surface) deeper than the surface layer portion of the substrate (where the reforming layer 240 or the hydrolyzed layer 242 is formed). Stated otherwise, the thickness of the surface layer portion is formed thinner than the incident depth of the vacuum ultraviolet radiation. As a result, the interatomic bonds at least between the surface layer portion of the substrate 210 and other parts are decomposed. In other words, when the surface layer portion of the substrate 210 is formed from the reforming layer 240, the interatomic bonds between the reforming layer 240 of the substrate 210 and other parts can be decomposed. Alternatively, when the surface layer portion of the substrate 210 is formed from the hydrolyzed layer 242, the interatomic bonds between the hydrolyzed layer 242 of the substrate 210 and other parts can be decomposed. According to this, because the surface layer portion of the substrate 210 can be readily removed, the catalyst 230 can be securely left in a predetermined pattern configuration (a configuration along the first area 212), and a highly accurate wiring can be readily formed.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a wiring substrate, consisting of:
    a first step of providing a substrate including C=C bonds and having a plurality of first areas and second areas that define areas for forming a plurality of wirings;
    a second step of washing the substrate with an alkali solution to provide the substrate with a uniform negative potential, the second step coming after the first step;
    a third step providing a first surface-active agent over an entire surface of the substrate to cationize the substrate, the first surface-active agent having an alkyl chloride system and the third step coming after the second step;
    a fourth step of droplet discharging a second surface-active agent directly over the first surface-active agent in the first areas and not in the second areas of the substrate to anionize only the first areas of the substrate, the fourth step coming after the third step;
    a fifth step of disposing a catalyst on the second surface-active agent, the fifth step coming after the fourth step; and
    a sixth step of depositing a metal layer on the catalyst to form a wiring, the sixth step coming after the fifth step.

2. A method for manufacturing a wiring substrate according to claim 1, wherein an ink jet is used to droplet discharge the second surface active agent.

3. The method of claim 1, wherein each droplet of the second surface-active agent includes a surface coated with an adhesive material.

* * * * *